(12) United States Patent
Kon et al.

(10) Patent No.: US 7,465,527 B2
(45) Date of Patent: Dec. 16, 2008

(54) RESIST MATERIAL, RESIST PATTERN AND FORMING METHOD FOR THE SAME, AND A SEMICONDUCTOR DEVICE AND MANUFACTURING METHOD FOR THE SAME

(75) Inventors: Junichi Kon, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/107,203

(22) Filed: Mar. 28, 2002

(65) Prior Publication Data
US 2003/0098464 A1 May 29, 2003

(30) Foreign Application Priority Data
Nov. 27, 2001 (JP) .............................. 2001-361506

(51) Int. Cl.
*G03F 7/00* (2006.01)
*G03F 7/004* (2006.01)

(52) U.S. Cl. .................... 430/270.1; 430/914; 430/919; 430/920; 430/921; 430/927; 430/171; 430/189

(58) Field of Classification Search .............. 430/270.1, 430/914, 919, 920, 921, 927, 171, 189
See application file for complete search history.

(56) References Cited
U.S. PATENT DOCUMENTS

| | | | |
|---|---|---|---|
| 4,491,628 A | 1/1985 | Ito et al. | |
| 5,403,695 A | 4/1995 | Hayase et al. | ............... 430/192 |
| 5,679,497 A | 10/1997 | Kimura | |
| 5,981,140 A | 11/1999 | Sato et al. | |
| 6,027,856 A * | 2/2000 | Nozaki et al. | ............ 430/281.1 |
| 6,096,478 A * | 8/2000 | Yamana | .................... 430/270.1 |
| 6,200,728 B1 | 3/2001 | Cameron et al. | ......... 430/270.1 |

(Continued)

FOREIGN PATENT DOCUMENTS

EP 0 594 452 A2 4/1994

(Continued)

OTHER PUBLICATIONS
Japanese Office Action dated Sep. 12, 2006 of JP2001-361506.

(Continued)

*Primary Examiner*—Amanda C. Walke
(74) *Attorney, Agent, or Firm*—Westerman, Hattori, Daniels & Adrian, LLP.

(57) ABSTRACT

The resist material contains a photo-acid generator having an absorption peak to exposure light having a wavelength of less than 300 nm, and a second photo-acid generator having an absorption peak to exposure light having a wavelength of 300 nm or more. The method for forming a resist pattern comprises a step for selectively exposing which exposes a coating film of the resist material to an exposure light having a wavelength of less than 300 nm, and a step for selectively exposing by using an exposure light having a wavelength of 300 nm or more. The semiconductor device comprises a pattern formed by the resist pattern. The method for forming a semiconductor device comprises a step for forming a resist pattern on an underlying layer by the aforementioned manufacturing method, and a step for patterning the underlying layer by etching using the resist pattern as a mask.

8 Claims, 12 Drawing Sheets

U.S. PATENT DOCUMENTS

| | | | |
|---|---|---|---|
| 6,261,743 B1 | 7/2001 | Pavelchek et al. | 430/325 |
| 6,280,911 B1 | 8/2001 | Trefonas, III | 430/326 |
| 6,391,520 B1 * | 5/2002 | Nakano et al. | 430/270.1 |
| 6,605,417 B2 * | 8/2003 | Nitta et al. | 430/326 |
| 6,692,888 B1 * | 2/2004 | Barclay et al. | 430/270.1 |
| 6,749,989 B2 * | 6/2004 | Hada et al. | 430/270.1 |
| 2003/0098464 A1 | 5/2003 | Kon et al. | |

FOREIGN PATENT DOCUMENTS

| | | |
|---|---|---|
| JP | 5-197151 | 8/1993 |
| JP | 7-098499 | 4/1995 |
| JP | 7-130651 | 5/1995 |
| JP | 7-219216 | 8/1995 |
| JP | 8-262743 | 10/1996 |
| JP | 10-73927 | 3/1998 |
| JP | 10-97060 | 4/1998 |
| JP | 11-297597 | 10/1999 |
| JP | 2000-347414 | 12/2000 |
| JP | 2001-228616 | 8/2001 |
| JP | 2002-49161 | 2/2002 |
| JP | 2002-6491 | 9/2002 |
| JP | 3901997 | 1/2007 |

OTHER PUBLICATIONS

Taiwanese Office Action dated Jun. 23, 2008 of TW 91106378.

* cited by examiner

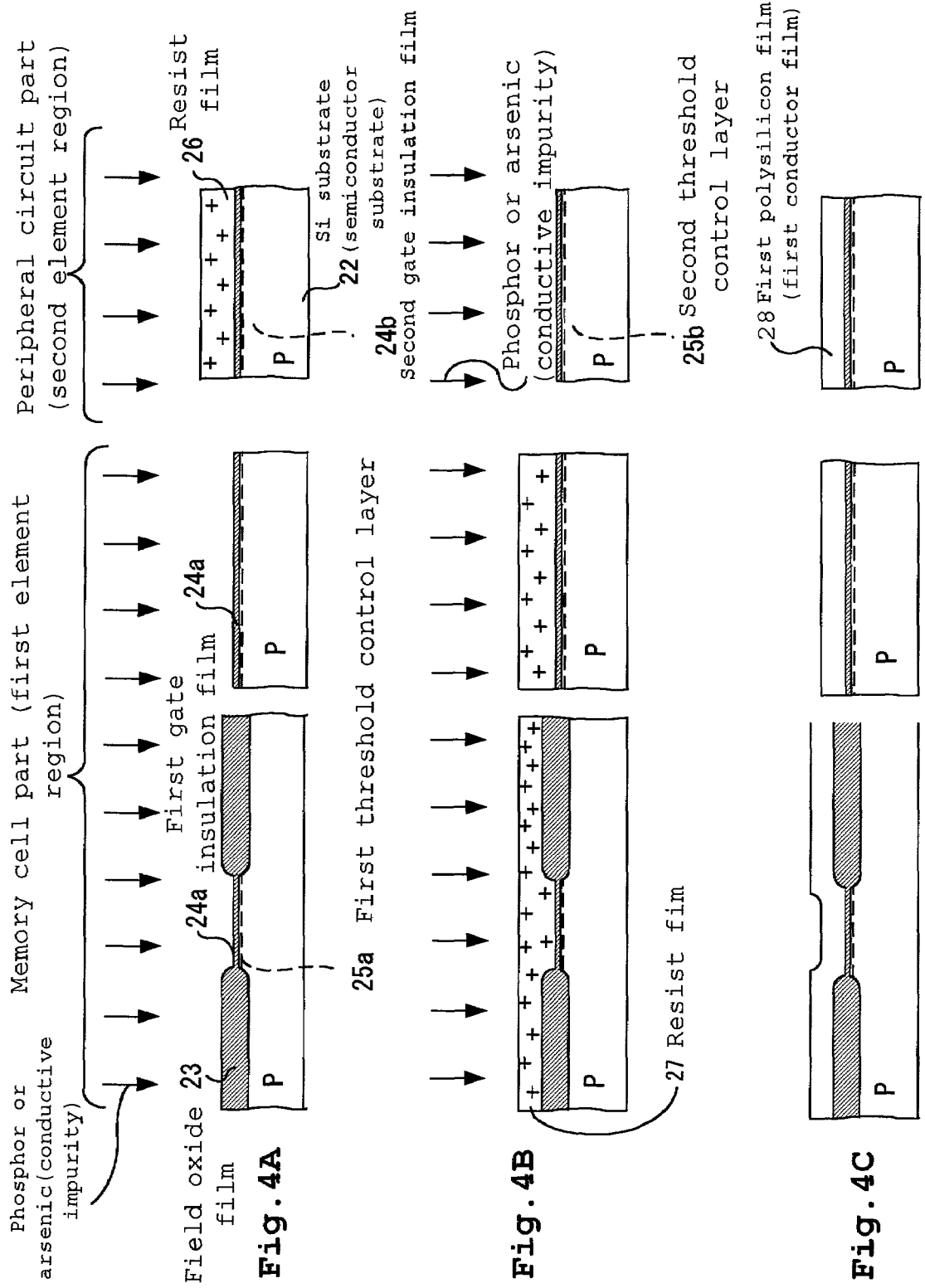

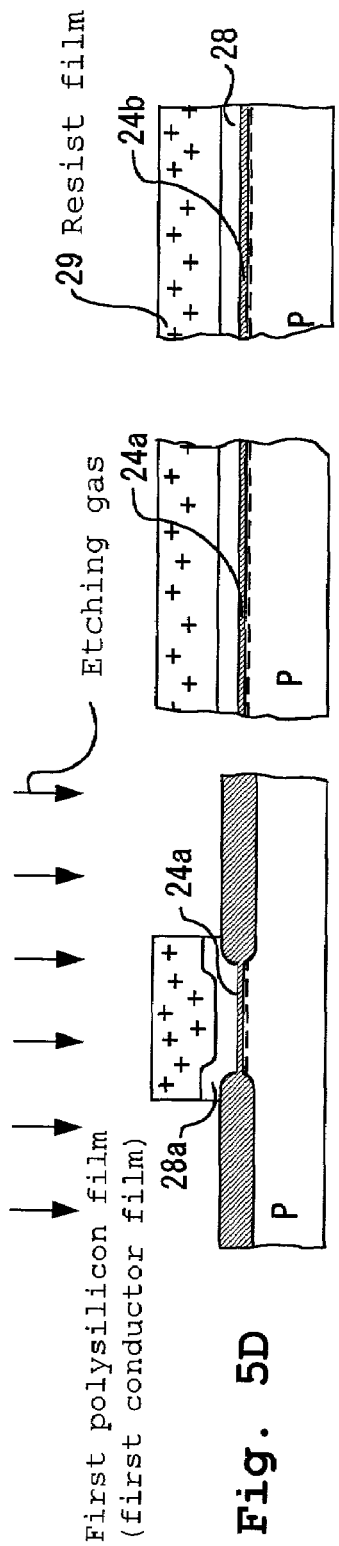
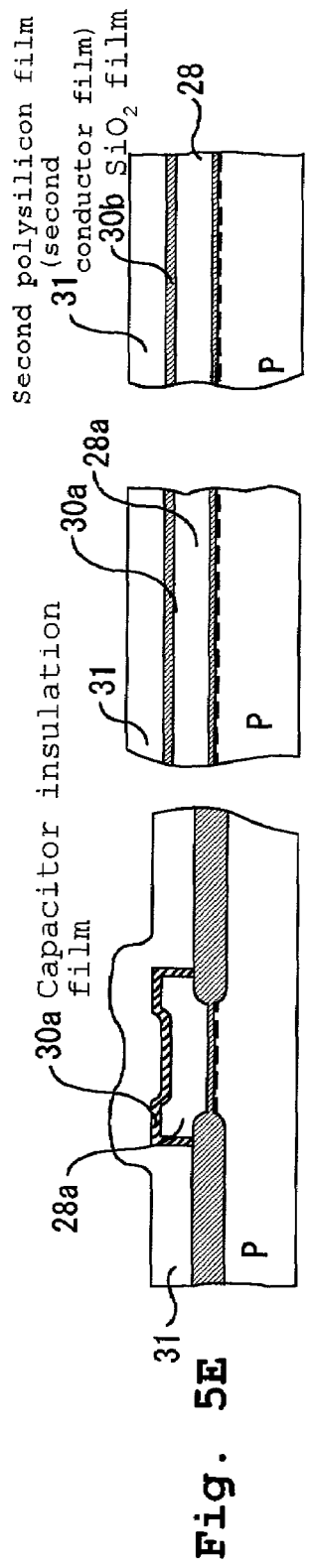
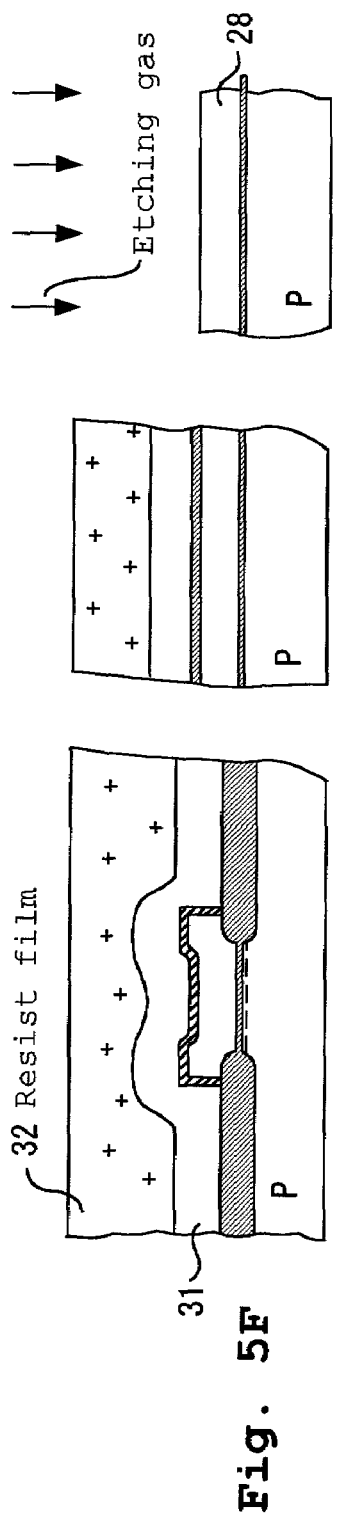
Fig. 5D
Fig. 5E
Fig. 5F

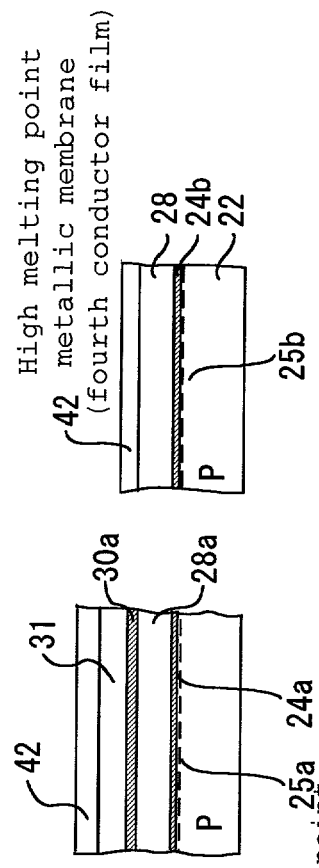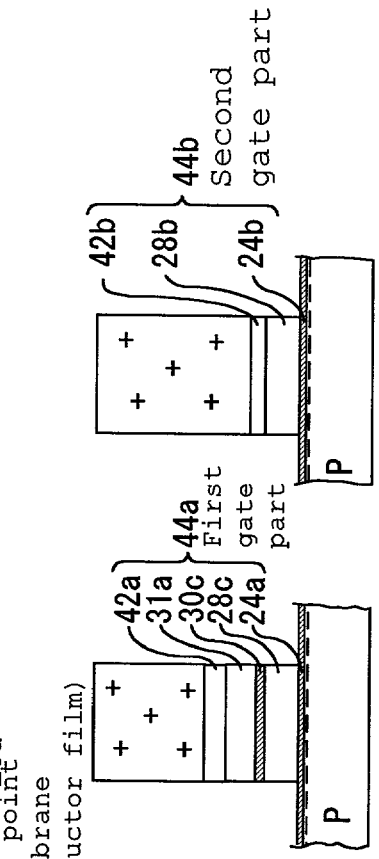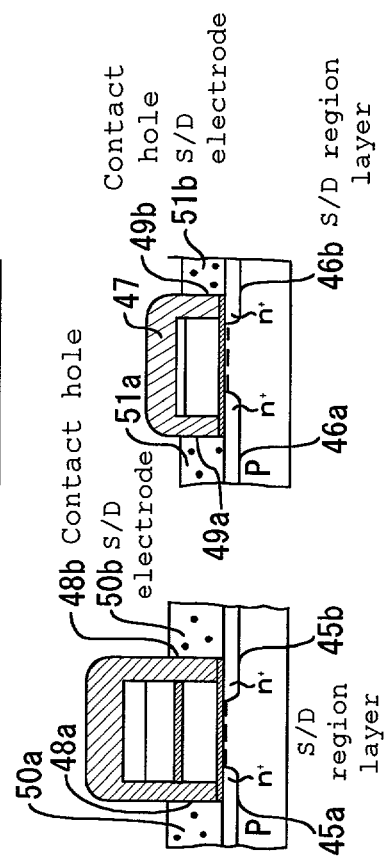

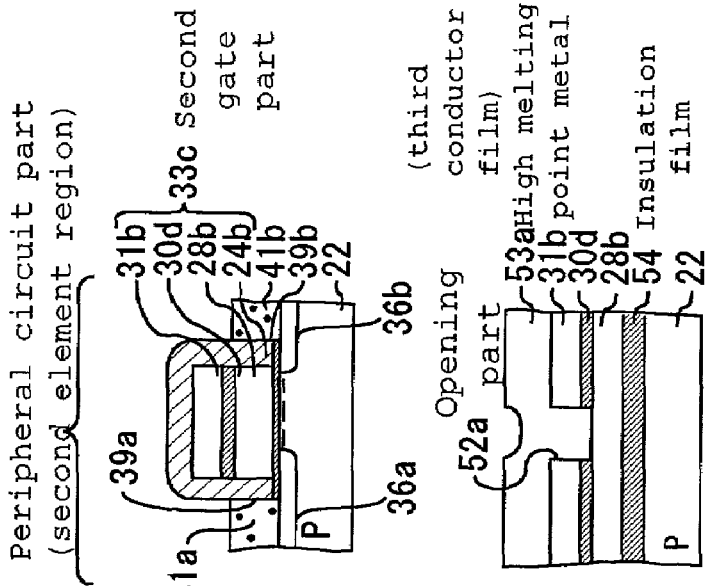
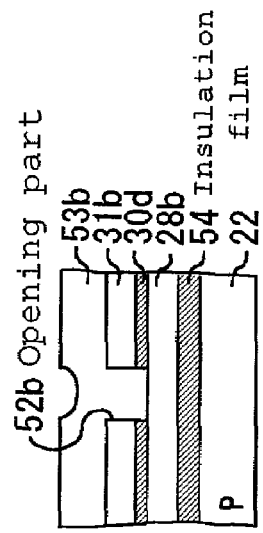
Fig. 8A Memory cell part (first element region)
Fig. 8B
Fig. 8C RESIST MATERIAL, RESIST PATTERN AND FORMING METHOD FOR THE SAME, AND A SEMICONDUCTOR DEVICE AND MANUFACTURING METHOD FOR THE SAME

CROSS-REFERENCE TO RELATED APPLICATIONS

This application is based upon and claims priority of Japanese Patent Application No. 2001-361506, filed, the contents being incorporated herein by reference.

BACKGROUND OF THE INVENTION

1. Field of the Invention

The present invention relates to a resist pattern which forms a fine pattern suitable for manufacturing a semiconductor device, a method for forming a resist pattern to form the resist pattern efficiently in a short time, a resist material suitable for forming a fine pattern by the resist pattern efficiently in a short time, a semiconductor device comprising a fine pattern formed by the resist pattern, and a method for manufacturing a semiconductor device for manufacturing the semiconductor device efficiently in a short time.

2. Description of the Related Art

The research and development of high performance LSI has been actively pursued for a long time, and in the development of these highly efficient LSI, fine patterning technology and resist materials are key features.

In this fine patterning technology, electron beam lithography in which a resist material is irradiated by an electron beam enables formation of a fine pattern with a width of 0.1 µm or less, and has therefore been extensively studied. As far as concerns highly efficient resist materials, the chemically amplified type resist material proposed by H. Ito of IBM Corp. USA are suitable for this electron beam lithography, and since they offer high resolution and high sensitivity, a great deal of research is being carried out on it (J. M. J. Frechet et al., Proc. Microcircuit Eng., 260 (1982), H. Ito et al., "Polymers in Electronics", ACS Symposium Series 242, T. Davidson, ed., ACS 11 (1984) and U.S. Pat. No. 4,491,628 (1985)). This chemically amplified type resist material contains a photo-acid generator. If a resist film of this chemically amplified type resist material is exposed to light, such as ultraviolet radiation, an electron beam, X-rays or a focused ion beam, an acid is produced from a photo-acid generator, and the exposed part changes due to a catalytic reaction in a bake performed after the exposure, to an alkali soluble (positive type) or insoluble (negative type) substance. This permits developing to be performed.

Recently, such chemically amplified type resist materials are becoming the materials of choice to form a fine pattern with the aforementioned electron ray lithography technique.

However, in the case of electron ray lithography technique, as compared with conventional lithography techniques in which the resist material is irradiated by UV light, the exposure takes much more time and it is not very efficient.

For this reason, to compensate for the low throughput in the electron beam lithography technique, parts of a resist film formed from a chemically amplified type resist material which form a fine pattern are exposed to an electron beam, and the remaining parts which form relatively large patterns are exposed at high speed to ultraviolet radiation as before.

However, in the case of this method, there are the following problems. In general, an onium salt photo-acid generator with high acid generating efficiency (high quantum yield) is added to the chemically amplified type resist material for the purpose of improving throughput. However, this onium salt photo-acid generator reacts to far ultraviolet radiation having a wavelength of less than 300 nm but not to near-ultraviolet light having a wavelength of 300 nm or more. Thus, in exposing a resist film formed by the chemically amplified type resist material, it cannot be used in an aligner having a g line (wavelength 436 nm) and i line (wavelength 365 nm) exposure device which is widely used for the mass production of semiconductor devices, so an improvement in throughput cannot be expected, and a fine pattern cannot be formed efficiently in a short time.

Hence, resist materials which would allow fine patterns to be formed efficiently in a short time suitable for manufacture of semiconductor devices, and their related technology, have not yet been developed in spite of the demand.

SUMMARY OF THE INVENTION

It is therefore an object of the present invention to provide a resist pattern which forms a fine pattern suitable for manufacturing a semiconductor device, a method for forming a resist pattern to form the resist pattern efficiently in a short time, a resist material suitable for forming a resist pattern to form a fine pattern by the resist pattern efficiently in a short time, a semiconductor device comprising a fine pattern by the resist pattern, and a method for manufacturing a semiconductor device for manufacturing a semiconductor device efficiently in a short time.

The resist material of the present invention contains a first photo-acid generator showing an absorption peak to exposure light having a wavelength of less than 300 nm, and a second photo-acid generator showing an absorption peak to exposure light having a wavelength of 300 nm or more.

In the resist material according to the present invention, by using two types of exposure light on the resist film formed by the resist material, a fine pattern can be exposed with one exposure light, and the comparatively large remaining patterns can be exposed at high speed by the other exposure light. Hence, various patterns can be obtained efficiently from the resist patterns in a short time. The resist material described in second aspect contains two kinds of acid generators which have different absorption peaks and numbers of molecules reactive to exposure light, so by using two types of exposure light on a resist film formed by the resist material, a fine pattern can be exposed with one exposure light, and the comparatively large remaining patterns can be exposed at high speed by the other exposure light. Hence, various patterns can be obtained efficiently from the resist patterns in a short time. In the resist material described in third aspect, to the resist film formed by the resist material, a fine pattern can be exposed with a charged electron particle beam, and the comparatively large remaining patterns can be exposed at high speed by ultraviolet light. Hence, various patterns can be obtained efficiently from the resist patterns in a short time.

The method for manufacturing the resist pattern of the present invention comprises A) a step for selectively exposing which selectively uses exposure light having a wavelength of less than 300 nm, and B) a step for selectively exposing which selectively uses exposure light having a wavelength of 300 nm or more, to expose a coating film of resist material according to the present invention.

In the method for manufacturing the resist pattern of the present invention, a fine pattern is formed by performing the A) step for selectively exposing, and a comparatively large pattern is formed by performing the B) step for selectively exposing, on the resist film of the resist material according to the present invention. Hence, the overall pattern is formed efficiently in a short time.

The resist pattern of the present invention is formed by the method for manufacturing the resist pattern of the present invention.

The resist pattern of the present invention is suitable for forming of fine patterns suitable for manufacture of semiconductor devices by performing etching treatment, etc.

The semiconductor device of the present invention comprises at least a pattern formed by the resist pattern of the present invention.

As the semiconductor device of the present invention has a fine pattern formed by the aforementioned resist pattern, it is of high quality and is highly efficient.

The method for manufacturing the semiconductor device of the present invention comprises a step for forming resist pattern which forms a resist pattern on an underlying layer by the method for manufacturing the resist pattern of the present invention, and a step for patterning which patterns the aforementioned underlying layer by etching using this resist pattern as a mask.

In the method for manufacturing the semiconductor device of the present invention, a fine resist pattern is formed on the base by performing an step for selectively exposing on a resist film formed by the resist material of the present invention, and a comparatively large resist pattern is formed on the base by performing a step for selectively exposing. Then, the aforementioned underlying layer is patterned using the resist pattern as a mask by a step for patterning, so a semiconductor device having a very fine pattern can be manufactured efficiently.

BRIEF DESCRIPTION OF THE DRAWINGS

FIGS. 4A through 4C are schematic sectional views (1) for describing a manufacturing method for FLASH EPROM that is one example of a manufacturing method for semiconductor device according to the present invention.

FIGS. 5D through 5F are schematic sectional views (2) for describing a manufacturing method for FLASH EPROM that is one example of a manufacturing method for semiconductor device according to the present invention.

FIGS. 7A through 7C are schematic sectional views for describing a manufacturing method for EPROM that is another embodiment of the manufacturing method for semiconductor device according to the present invention.

FIGS. 8A through 8C are schematic sectional views for describing a manufacturing method for EPROM that is another embodiment of the manufacturing method for semiconductor device according to the present invention.

Figure 1:
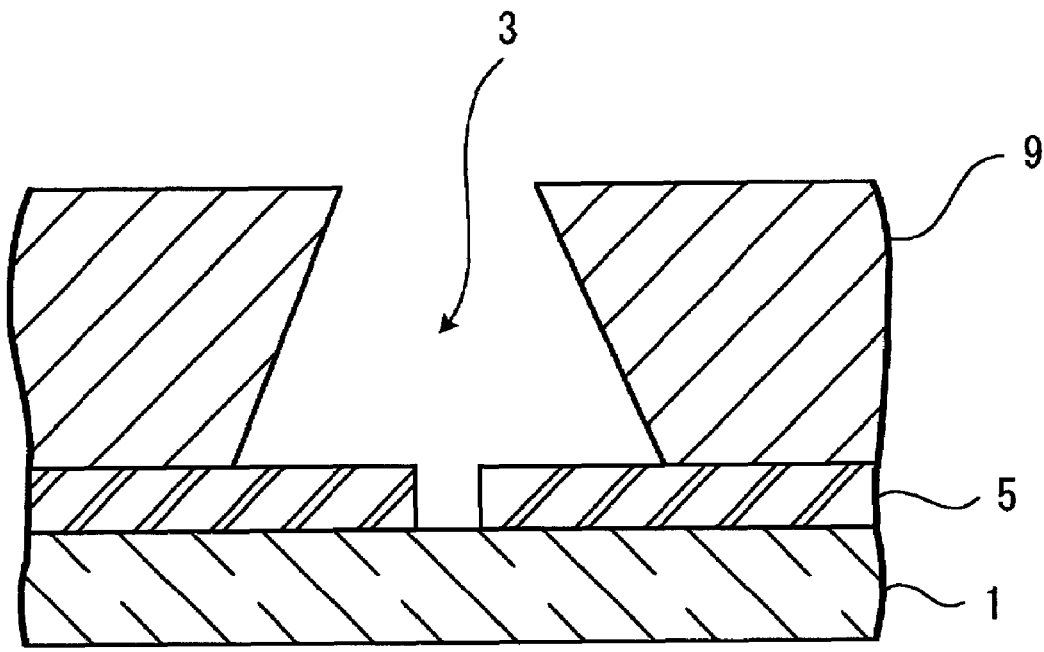
FIG. 1 is a schematic view describing an example of forming a resist pattern for manufacturing a T type gate electrode using the resist material of the present invention.

DESCRIPTION OF THE PREFERRED EMBODIMENTS (Resist Material)

The resist material of the present invention contains a first photo-acid generator and a second photo-acid generator. It also contains a resin (also referred to as a "base material resin"), a solvent, and other suitable components which may be selected as necessary.

-First Photo-Acid Generator-

This first photo-acid generator is a compound which exhibits an absorption peak to exposure light having a wavelength of less than 300 nm, and which generates an acid when irradiated by this exposure light.

There is no particular limitation on the aforementioned first photo-acid generator provided that it is the aforementioned compound. It may be selected according to the purpose, but it is preferred that the number of molecules which react to exposure light having a wavelength of 300 nm or more, is ⅕ of the number of molecules which react to exposure light having a wavelength of less than 300 nm. Also, it is more preferred that it is an onium salt compound. From a viewpoint of sensitivity and resolution of the aforementioned resist material, it is particularly preferred that it is an onium salt compound expressed by the general formula I: $(R^1)^+X^-$. One of these compounds may be used alone, or two or more may be used together.

$(R^1)^+$ represents a cation having the following structural formula, and specifically represents triallyl sulphonium cation or diallyl iodinium cation. Of these, triphenylsulphonium cation and diphenyliodinium cation are particularly preferred.

[Compound 3]

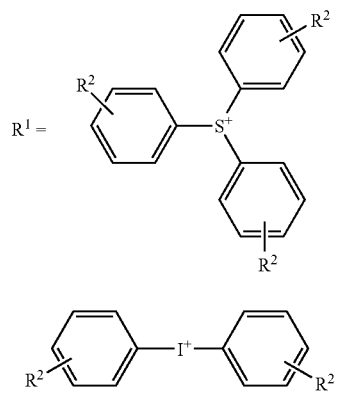

$R^2$ represents a substituent, for example a hydrogen atom, a halogen atom, a straight chain, branched or cyclic alkyl group, or a straight chain, branched or cyclic alkoxy group. These may be substituted by substituent groups. It is preferred that the number of carbon atoms in the alkyl group or alkoxy group is, for example, about one to six. There is no particular limitation on the substitution position of $R^2$, which may be suitably selected according to the purpose.

In the aforementioned general formula I, $X^-$ represents an anion, and specifically, $C_nF_{2n+1}SO_3-$ or the like is preferred.

There is no particular limitation on the exposure light having a wavelength of less than 300 nm and it may be suitably selected according to the purpose, but a charged particle beam or the like is more preferred.

There is no particular limitation on the amount of the first photo-acid generator in the resist material, and the second photo-acid generator, resin, solvent and other components may be suitably selected as required.

-Second Photo-Acid Generator-

This second photo-acid generator is a compound which exhibits an absorption peak to exposure light having a wavelength of higher than 300 nm, and which generates an acid when irradiated by this exposure light.

There is no particular limitation on the aforementioned second photo-acid generator provided that it is the aforementioned compound. It may be selected according to the purpose, but it is preferred that the number of molecules which react to exposure light having a wavelength of less than 300 nm, is ⅕ of the number of molecules which react to exposure light having a wavelength of 300 nm or more. It is preferred that it is at least one type of compounds expressed by the following general formulae (II)-(1)-(9). One of these compounds may be used alone, or two or more may be used together.

[Compound 4]

General Formula (II)

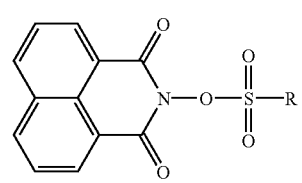

(1)

R = straight chain, branched or cyclic
alkyl group with 1-6 carbon atoms
$C_nF_{2n+1}$ (n = 1–5),

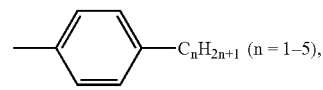

$C_nH_{2n+1}$ (n = 1–5),

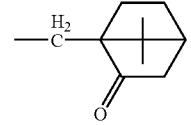

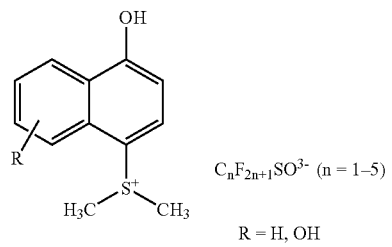

(2)

$C_nF_{2n+1}SO_3^-$ (n = 1–5)

R = H, OH

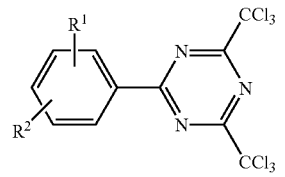

(3)

$R^1, R^2$ = H, Cl, $C_nH_{2n+1}O$ (n = 1–5)

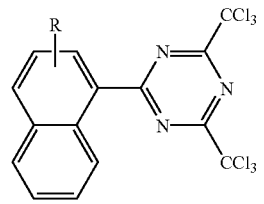

(4)

R = H, Cl, $C_nH_{2n+1}O$ (n = 1–5)

-continued (5)

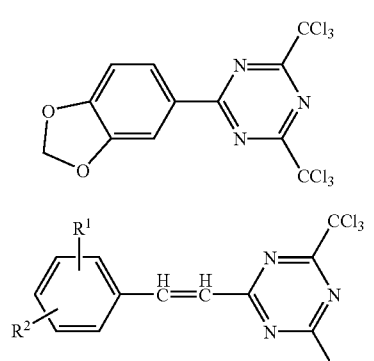

(6)

R$^1$, R$^2$ = H, Cl, C$_n$H$_{2n+1}$O (n = 1–5), CH$_2$OHCH$_2$O (7)

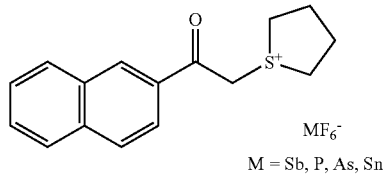

MF$_6^-$

M = Sb, P, As, Sn (8)

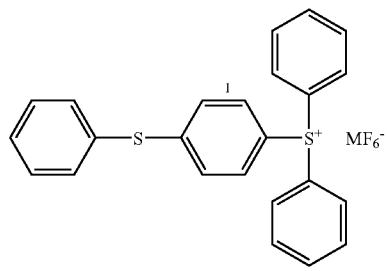

M = Sb, P, As, Sn (9)

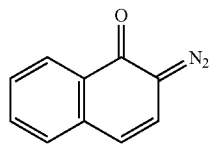

Although there is no particular limitation on the exposure light of wavelength 300 nm or more which may be suitably selected according to the purpose, from the viewpoint of performing efficient patterning, ultraviolet radiation is preferred, and the g line (wavelength 436 nm) or i line (wavelength 365 nm) of a mercury vapor lamp is more preferred.

There is no particular limitation on the amount of the resist material in the second photo-acid generator, and it may be suitably selected according to the second photo-acid generator, resin, solvent and other components.

-Resin-

There is no particular limitation on the resin, which may be suitably selected from resins known as base material resins in resist materials according to the art, but it preferably contains at least one species selected from (meth)acrylic ester polymer, vinyl phenol polymer, N-substituted maleimide polymer, styrene polymer, cycloolefin polymer, (meth)acrylic ester/ cycloolefin maleic acid anhydride copolymer, fumaric acid polymer, vinyl benzoic acid polymer, norbornane carboxylic acid and itaconic acid polymer. (Meth)acrylic ester polymer is more preferred in the deep ultraviolet range from the viewpoint that high transparency can be maintained. Of these, from the viewpoint of its high sensitivity and excellent resolution, a polarity changeable resin using a catalytic proton reaction is preferred. One of these may be used alone, or two or more may be used together.

When this polarity changeable resin is used as the aforementioned resin, the resist material is a chemically amplified type resist material. In the case of a chemically amplified type resist material using the polarity changeable resin, in the exposure part, the aforementioned protective group which is acid dissociative in a positive resist dissociates and the alkali dissolution rate improves, whereas in a negative resist, due to the crosslinking reaction of the crosslinking agent, the alkali dissociation rate falls.

In the polarity changeable resin, it is preferred from the viewpoint of balance between ease of patterning and solubility in a basic aqueous solution, that 5-80% of all polar groups in this resin are replaced by a protective group, and if the resin is a copolymer, that the crosslinking rate in this copolymer is 5-80%. Moreover, from the viewpoint of maintaining ease of patterning and solubility in a basic aqueous solution at a high level, that 20-80% of all polar groups in this resin are replaced by a protective group, and that the crosslinking rate in the copolymer is 20-80%.

There is no particular limitation on the protective group which may be suitably selected according to the purpose, but from the viewpoint of utilizing a change of polarity in hydrophilicity by elimination of the protective group, a hydrophobic protective group is preferred.

There is no particular limitation on the hydrophobic protective group, which may be suitably selected according to the purpose, but it is preferably at least one of t-butoxy carbonyl, tetrahydropyrane, t-butyl or an alicyclic functional group.

It is preferred that the alicyclic functional group is at least one species selected from substituents expressed by the following structural formula A, and substituents expressed by the following structural formula B.

[Compound 5]

Structural Formula A

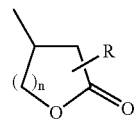

[Compound 6]

Structural Formula B

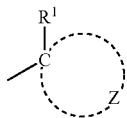

In the present invention, a lactone functional group is preferred among the substituents expressed by the structural formula A.

Here, the reaction mechanism in the exposure part of the chemically amplified type resist using the aforementioned polarity changeable resin which has a carboxyl group replaced by the aforementioned lactone functional group as the aforementioned protective group, will be described. As shown by the following reaction equation, in the exposure part, due to the action of the first photo-acid generator or the second photo-acid generator represented by "PAG" in response to light irradiation, the lactone functional group dissociates, the carboxyl group replaced by the lactone functional group becomes a carboxyl group, H⁺ (protons) are generated and the alkali dissolution rate improves.

[Compound 7]

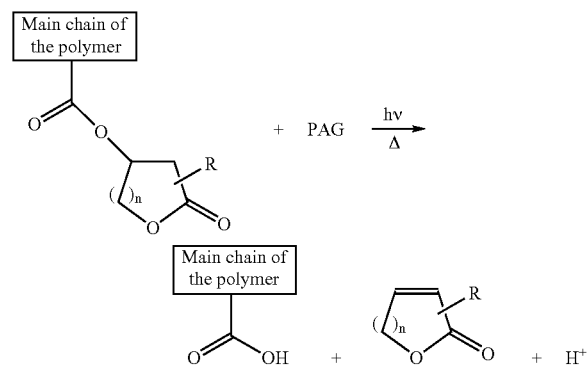

Here, describing the reaction mechanism in the exposure part of the chemically amplified type resist using the polarity changeable resin comprising a carboxyl group substituted by a 5-member lactone ring as aforementioned lactone functional group which functions as aforementioned protective group, in the exposure part, the 5-member lactone ring dissociates due to the action of the first photo-acid generator or second photo-acid generator represented by "PAG" when irradiated by light, the carboxyl group substituted by the 5-member lactone ring becomes a carboxyl group, H⁺ (protons) are generated and the alkali dissolution rate improves, as shown by the following reaction equation.

[Compound 8]

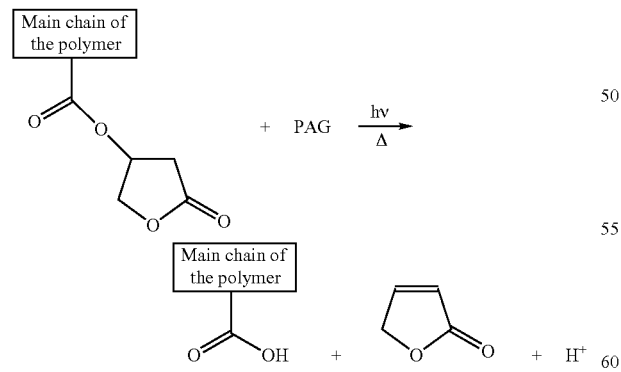

In the present invention, it is preferred that the substituent expressed by the following structural formula B has the following structural formula, and particularly preferred that it is an adamantyl functional group or a norbornane functional group.

[Compound 9]

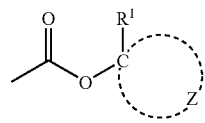

Here, the reaction mechanism in the exposure part of the chemically amplified type resist using the aforementioned polarity changeable resin which has a carboxyl group replaced by the aforementioned adamantyl functional group as the aforementioned protective group, will be described. As shown by the following reaction equation, in the exposure part, due to the action of the first photo-acid generator or the second photo-acid generator represented by "PAG" in response to light irradiation, the adamantyl functional group dissociates, the carboxyl group replaced by the adamantyl functional group becomes a carboxyl group, H⁺ (protons) are generated and the alkali dissolution rate improves.

[Compound 10]

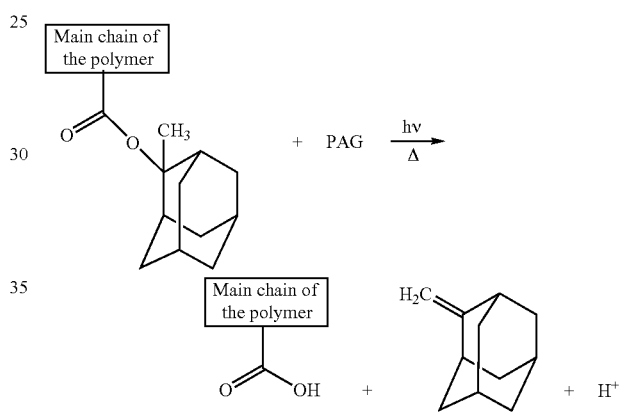

When the aforementioned resin is a copolymer, there is no particular limitation on the monomer unit of this copolymer, and it may be suitably selected according to the purpose. Examples are γ-butyrolactone-3-ilmethacrylate or 2-alkyl-2-adamantyl methacrylate.

A suitable example of the copolymer is the copolymer of γ-butyrolactone-3-ilmethacrylate and 2-alkyl-2-adamantyl methacrylate shown below.

[Compound 11]

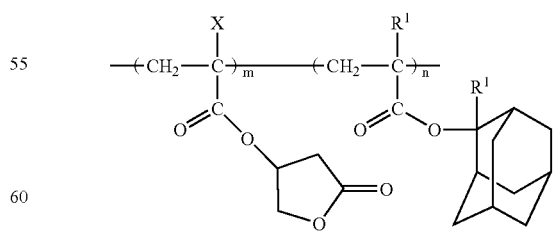

where, n and m in the formula represent the degree of polymerization.

There is in no particular limitation on the mass average molecular weight of the aforementioned resin which may be suitably selected according to the purpose, but it is preferably 2,000-1,000,000 and more preferably 3,000-50,000.

-Solvent-

There is no particular limitation on the aforementioned solvent which may be suitably selected from solvents used in the art for resist materials according to the purpose, convenient examples are ethyl lactate, methyl amyl ketone, methyl-3-methoxypropionate, ethyl amyl ketone, methyl-3-methoxypropionate, ethyl-3-ethoxypropionate and propylene glycol methyl ether acetate. One of these may be used alone, or two or more may be used together.

There is no particular limitation on the amount of the aforementioned resist material in the solvent which may be suitably selected according to fitness for application such as coating homogeneity at the time of application, and thickness of the resist formed.

When the solubility of the solute in the aforementioned resist material and coating homogeneity are low, an auxiliary solvent may be added to the aforementioned solvent (main solvent).

As examples of the aforementioned auxiliary solvent, butyl acetate, γ-butyrolactone and propylene glycol methyl ether may for example be mentioned. One of these may be used alone, or two or more may be used together.

The amount of auxiliary solvent used is preferably 1-30 mass %, and more preferably 10-20 mass %, relative to the main solvent.

-Other Components-

There is no particular limitation on other components unless impairing effects of the invention, which may be suitably selected according to the purpose. The crosslinking agent when the aforementioned resist material is a negative type may be various well-known additives, for example, N-methyl pyrrolidone (basic additive).

The type and amount of other components in the aforementioned resist material differ according to the first photo-acid generator, second photo-acid generator, resin and organic solvent, and cannot be uniquely specified, but they may be suitably selected according to the purpose.

The aforementioned crosslinking agent is used when the aforementioned resist material is a negative type. There is no particular limitation and it may be suitably selected according to the purpose, but an alkali soluble agent which produces crosslinking due to acids is preferred, for example, an amino crosslinking agent.

The amino crosslinking agent may for example conveniently be a melamine derivative, urea derivative or uril derivative. One of these may be used alone, or two or more may be used together.

The urea derivative may for example be urea, alkoxy methylene urea, N-alkoxy methylene urea, ethylene urea, ethylene urea carboxylic acid or their derivatives.

The melamine derivative may for example be methylene or alkoxymethylene melamine, or its derivatives.

The uril derivative may for example be benzoguanamine or glycouril, or their derivatives.

Although the amount of crosslinking agent in the resist material is different according to the type and content of the resin or water-soluble aromatic compound and cannot be specified uniquely, it may be determined suitably according to the purpose.

As the resist material of the present invention, when using ultraviolet radiation as the exposure light having a wavelength of 300 nm or more, from the viewpoint of obtaining sufficient patterning characteristics (light is made to reach to the deep part of the resist film), it is preferred that the absorbance in the wavelength region of this ultraviolet radiation is 1.75 or less, and more preferred that the absorbance in the far ultraviolet range is 1.6 or less.

The resist material of the present invention, in the case of a positive resist, may be obtained by forming a resist film by coating on a substrate, exposing it in a fine pattern using exposure light (e.g., a charged particle beam) having a wavelength of less than 300 nm, and exposing a relatively large pattern using exposure light (e.g., ultraviolet light) having a wavelength of 300 nm or more, or the exposure is performed in the reverse sequence. After each individual exposure or after all the exposures, the product is baked and developed to form a fine pattern by the resist pattern. On the other hand, in the case of a negative resist, baking and developing are performed after all exposures so as to form a fine pattern by the resist pattern.

The method for forming the resist pattern by the resist material of the present invention and the size and thickness of the resist pattern are not particularly limited, and may be suitably selected according to the purpose. In particular, the thickness may be suitably determined by the underlying layer (substrate) which is being patterned and by etching conditions, but it is generally of the order of 0.1-10 μm and preferred that it is of the order of 0.2-2 μm.

-Uses-

The resist material of the present invention may be conveniently used to form patterns in which the opening diameter (an opening diameter in a case of hole pattern, and a distance between adjacent patterns, in a case of line pattern) is less than 10 μm, and in particular to form patterns in which the opening diameter (an opening diameter in a case of hole pattern, and a distance between adjacent patterns, in a case of line pattern) is less than 0.2 μm when the exposure light is a charged particle beam or to manufacture high electron transfer transistor devices. The following may be used for the resist pattern, the method for manufacturing the resist pattern, the semiconductor devices and the method for manufacturing semiconductor devices according to the present invention.

(Resist Pattern)

The resist pattern of the present invention may conveniently be formed by the method for manufacturing resist patterns of the present invention, described hereafter.

The resist pattern of the present invention may for example conveniently be used for functional parts such as mask patterns, reticle patterns, magnetic heads, LCD (Liquid Crystal Displays), PDP (Plasma Display Panels) or SAW filters (Surface Acoustic Wave Filters), optical parts used for wiring by light, minute devices such as micro-actuators and semiconductor devices, and may also be conveniently used for the semiconductor device of the present invention, described later.

The method for manufacturing the resist pattern of the present invention, including the resist pattern of the present invention, will now be described with explanations.

(Method for Manufacturing Resist Pattern)

The method for manufacturing the resist pattern of the present invention comprises a step for forming resist film, A) a step for selectively exposing and B) a step for selectively exposing, and may also comprise a step for baking, a step for developing and another step if required.

-Step for Forming Resist Film-

The step for forming resist film is a step which forms a resist film using the resist material of the present invention.

There is no particular limitation on the method for forming the resist film which may be conveniently selected from among those known in the art, but for example it is convenient to form the resist film by coating the resist material.

There is no particular limitation on the coating method which may be conveniently selected from among those known in the art according to the purpose, but spin coating may for example be mentioned.

The resist film may be formed on an underlying layer (substrate). There is no particular limitation on the underlying layer (substrate) which may be conveniently selected according to the purpose, but if the resist pattern is formed on a semiconductor device, the underlying layer (substrate) is a substrate such as a silicon wafer or the like.

-Step for Selectively Exposing-

The step for selectively exposing is a step which selectively exposes the resist film formed in the step for forming resist film using exposure light having a wavelength of less than 300 nm.

There is no particular limitation on the exposure light having a wavelength of less than 300 nm and this may be conveniently selected according to the purpose, but a charged particle beam is particularly preferred.

There is no particular limitation on method for selectively performing the exposure, and this may be conveniently selected according to the purpose, but a method known in the art using a mask pattern or the like may be mentioned. An exposure device may be used for the exposure, such as for example an EB exposure device.

There is no particular limitation on the exposure conditions, and may be conveniently selected according to the purpose.

-Step for Selectively Exposing-

The step for selectively exposing is a step which selectively exposes the resist film formed in the step for forming resist film using exposure light having a wavelength of 300 nm or more.

There is no particular limitation on the exposure light having a wavelength of 300 nm or more, and this may be conveniently selected according to the purpose, but from the viewpoint of efficient patterning, ultraviolet light is preferred and the g line (wavelength 436 nm) or i line (wavelength 365 nm) is particularly preferred.

There is no particular limitation on method for selectively performing the exposure, and this may be conveniently selected according to the purpose, but a method known in the art using a mask pattern or the like may be mentioned. An exposure device may be used for the exposure, such as for example a mercury vapor lamp.

There is no particular limitation on the exposure conditions, and may be conveniently selected according to the purpose.

There is no limit in the order of exposing and for instance, the A) step for selectively exposing or B) step for selectively exposing may be performed first.

-Baking-

Baking is a step which bakes the resist film which has been exposed after the step for selectively exposing and step for selectively exposing.

There is no particular limitation on the conditions and method for baking, and these may be conveniently selected according to the purpose, however the temperature is for example of the order of 70-150° C. but preferably 90-130° C., and the time is of the order of 10 secs-5 minutes but preferably 40 secs-100 secs.

-Developing-

Developing is a step which develops the resist film after exposure.

There is no particular limitation on the developing method, which may be conveniently selected according to the purpose. Developing in water or developing in a weakly alkaline aqueous solution may be performed, but from the viewpoint of low cost and efficiency, developing in water is preferred.

There is no particular limitation on developing conditions and methods, which may be conveniently selected according to the purpose.

In the method for manufacturing the resist pattern of the present invention, in the case of a positive resist for example, a resist film is formed by coating on a substrate, exposing it in a step for selectively exposing which exposes fine patterns using exposure light (e.g., a charged particle beam) having a wavelength of less than 300 nm, and exposing it in a step for selectively exposing which exposes relatively large patterns using exposure light (e.g., ultraviolet light) having a wavelength of 300 nm or more, or conversely, the step for selectively exposing is performed after the step for selectively exposing. The step for baking and step for developing are performed after the step for selectively exposing or step for selectively exposing, or after the step for selectively exposing and step for selectively exposing, so as to form the fine patterns by the resist pattern. In the case of a negative resist, the step for baking and step for developing are performed after the step for selectively exposing and step for selectively exposing so as to form fine patterns from the resist pattern.

The resist pattern formed by the method for forming a resist pattern of the present invention, is the resist pattern of the present invention. This resist pattern may for example conveniently be used for functional parts such as mask patterns, reticle patterns, magnetic heads, LCD (Liquid Crystal Displays), PDP (Plasma Display Panels) or SAW filters (Surface Acoustic Wave Filters), optical parts used for wiring by light, minute devices such as micro-actuators and semiconductor devices, and may also be conveniently used for the semiconductor device of the present invention, described later.

The method for manufacturing the resist pattern of the present invention may conveniently be used for forming a pattern having an opening diameter (an opening diameter in a case of hole pattern, and a distance between adjacent patterns, in a case of line pattern) of 0.2 μm or less, may conveniently be used for manufacturing a high electron mobility transistor device, and may, in particular, conveniently be used for the semiconductor device and method for manufacturing a semiconductor device for the present invention.

(Semiconductor Device and Method for Manufacturing a Semiconductor Device)

There is no particular limitation on the semiconductor device of the present invention provided that it comprises a pattern from the resist pattern of the present invention, and it comprises parts known in the art which may be suitably selected according to the purpose.

Specific examples of the semiconductor device of the present invention are flash memories, DRAM, FRAM and high electron mobility transistor devices.

The semiconductor device of the present invention may be conveniently manufactured by the method for manufacturing a semiconductor device for the present invention described below.

The method for manufacturing a semiconductor device for the present invention comprises a step for forming resist pattern and a step for patterning, and may also comprise other steps which are suitably selected according to the need.

The step for forming resist pattern is a step which forms a resist pattern on the underlying layer by the aforementioned method for forming a resist pattern.

The underlying layer on which the resist pattern is formed may be a surface layer of various parts of the semiconductor device, the substrate of a silicon wafer or its surface layer.

As the semiconductor device, when a T-shaped gate electrode used for high electron mobility transistor devices are manufactured, for example, in the step for forming resist pattern, the resist film formed by the resist material comprises at least two layers. In the case of a two-layer construction, a large opening may be formed in the upper layer, and a smaller opening than this opening may be formed in the lower layer. In the case of a three-layer construction, a large opening may be formed in the middle layer, and a smaller opening than this opening may be formed in the lower layer.

Figure 2:
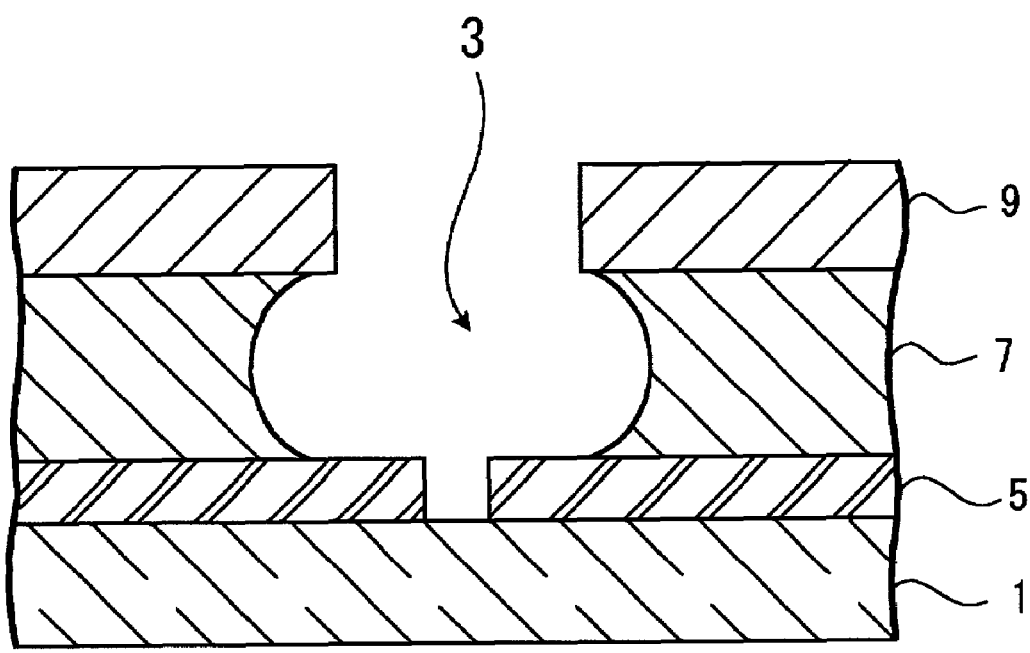
FIG. 2 is a schematic view describing another example of forming a resist pattern for manufacturing a T type gate electrode using the resist material of the present invention.

In this process, the resist material of the present invention may be used for the resist film. In particular, as the resist material of the present invention, when the resist film has a two-layer construction, a chemically amplified material may conveniently be used in the upper layer, and when the resist film has a three-layer construction, a chemically amplified material may conveniently be used in the middle layer, i.e., in the layer above the lower layer. When the upper layer is patterned, the upper layer may be formed into a reverse taper shape after developing by suitably selecting exposure conditions, as shown in FIGS. 1 and 2.

The step for patterning is a step for patterning wherein etching is performed using the resist pattern formed by the step for forming resist pattern as a mask.

There is no particular limitation on the etching method which may be suitably selected according to the purpose from the methods known in the art, e.g., dry etching. There is no particular limitation on the etching conditions which may be suitably selected according to the purpose.

According to the method for manufacturing a semiconductor device for the present invention, various types of semiconductor device may be efficiently manufactured including for example, flash memories, DRAM, FRAM and high electron mobility transistor devices.

The present invention will now be described in detail by way of specific examples, but it should be understood that the invention is not to be construed as being limited by these examples in any way.

EXAMPLE 1

-Preparation of Resist Material-

A positive type resist material was prepared, comprising 100 mass parts of polyvinyl phenol (wherein 30 percent of total polarity is substituted by t-butoxycarbonyl groups) as the resin, 2 mass parts of diphenyliodinium triphlate as the first photo-acid generator, 5 mass parts of a substance wherein, in the general formula (II)-(1), $R=CH_3$ as the second photo-acid generator, and 400 mass parts of propylene glycol monomethylether acetate as the solvent.

-Forming of Resist Pattern-

A resist pattern was formed using this positive resist material. Specifically, the positive resist material was coated on a Si substrate by spin coating, and a resist film was formed by baking at 100° C. for 60 seconds. This resist film was exposed to the i line (365 nm) to form a rectangle of 1 μm side using an exposure device. After exposure, a post-exposure bake (PEB) was performed at 100° C. for 60 seconds, and it was then exposed to a charged particle beam to give an isolated line pattern of 0.10 μm width at a different position from the exposure position of the i line using an EB exposure device. After exposure, it was baked at 100° C. for 60 seconds. Subsequently, it was developed for 60 seconds using a 2.38 mass % aqueous solution of tetramethylammonium hydroxide.

Due to the above, a rectangular pattern of 1 μm side and an isolated line pattern of 0.10 μm width were simultaneously formed more efficiently and in a shorter time from the resist pattern than if both patterns were formed only by EB exposure.

EXAMPLE 2

-Preparation of Resist Material-

A positive type resist material was prepared, comprising 100 mass parts of a copolymer of polyvinyl phenol and t-butyl acrylate as the resin, 5 mass parts of triphenylsulphonium triphlate as the first photo-acid generator, 5 mass parts of a substance wherein, in the general formula (II)-(2), $R=H$ and $n=1$, as the second photo-acid generator, and 400 mass parts of ethyl lactate as the solvent.

-Forming of Resist Pattern-

A resist pattern was formed using this positive resist material by the following processes A and B.

In process A, the positive resist material prepared in Example 1 was coated on a Si substrate by spin coating, and a resist film was formed by baking at 120° C. for 60 seconds. Next, this resist film was exposed to the g line (436 nm) to form a rectangle of 20 μm side using an exposure device. After exposure, a post-exposure bake (PEB) was performed at 120° C. for 60 seconds. The product was developed for 60 seconds using a 2.38 mass % aqueous solution of tetramethylammonium hydroxide. Next, it was exposed to a charged particle beam to give an isolated line pattern of 0.05 μm width at a different position from the exposure position of the g line using an EB exposure device. After exposure, it was baked at 120° C. for 60 seconds. Subsequently, it was developed for 60 seconds using a 2.38 mass % aqueous solution of tetramethylammonium hydroxide.

In process B, the positive resist material prepared in Example 1 was coated on a Si substrate by spin coating, and a resist film was formed by baking at 120° C. for 60 seconds. Next, this resist film was exposed to the g line (436 nm) to form a rectangle of 20 μm side using an exposure device. Next, it was exposed to a charged particle beam to give an isolated line pattern of 0.05 μm width at a different position from the exposure position of the g line using an EB exposure device. After exposure, it was baked at 120° C. for 60 seconds. Subsequently, it was developed for 60 seconds using a 2.38 mass % aqueous solution of tetramethylammonium hydroxide.

Due to the aforementioned processes A and B, a rectangular pattern of 20 μm side and an isolated line pattern of 0.05 μm width were simultaneously formed more efficiently and in a shorter time from the resist pattern than if both patterns had been formed only by EB exposure. No difference was observed in the resolution performance of the resist between process A and process B, and in both cases, fine patterns by the resist patterns were formed.

EXAMPLE 3

-Preparation of Resist Material-

A negative type resist material was prepared, comprising 100 mass parts of polyvinylphenol as the resin, 10 mass parts of hexamethoxymethylamine as the crosslinking agent, 5 mass parts of diphenyliodinium perfluorate (n=4) as the first photo-acid generator, 10 mass parts of a substance wherein, in the general formula (II)-(3), $R_1$=p-$CH_3O$ and $R_2$=H, as the second photo-acid generator, and 550 mass parts of propylene glycol monomethylether acetate as the solvent.

-Forming of Resist Pattern-

A resist pattern was formed using this negative resist material. The negative resist material was coated on a Si substrate by spin coating, and a resist film was formed by baking at 100° C. for 60 seconds. This resist film was exposed to the i line (365 nm) to form a rectangle of 10 μm side using an exposure device. After exposure, a post-exposure bake (PEB) was performed at 100° C. for 60 seconds. Next, it was exposed to a charged particle beam to give an isolated line pattern of 0.05 μm width at a different position from the exposure position of the i line using an EB exposure device. After exposure, it was baked at 100° C. for 120 seconds. Subsequently, it was developed for 120 seconds using a 2.38 mass % aqueous solution of tetramethylammonium hydroxide.

Due to the above, a rectangular pattern of 10 μm side and an isolated line pattern of 0.05 μm width were simultaneously formed more efficiently and in a shorter time from the resist pattern than if both patterns were formed only by EB exposure.

EXAMPLE 4

A positive resist material was prepared as in Example 1 except that, in Example 1, the second photo-acid generator was a substance expressed by the general formula (II)-(4) wherein R=H, and a resist pattern was formed using this positive resist material.

Due to the above, a rectangular pattern of 1 μm side and an isolated line pattern of 0.10 μm width were simultaneously formed more efficiently and in a shorter time from the resist pattern than if both patterns were formed only by EB exposure.

EXAMPLE 5

A positive resist material was prepared as in Example 1 except that, in Example 1, the second photo-acid generator was a substance expressed by the general formula (II)-(5), and a resist pattern was formed using this positive resist material.

Due to the above, a rectangular pattern of 1 μm side and an isolated line pattern of 0.10 μm width were simultaneously formed more efficiently and in a shorter time from the resist pattern than if both patterns were formed only by EB exposure.

EXAMPLE 6

A positive resist material was prepared as in Example 1 except that, in Example 1, the second photo-acid generator was a substance expressed by the general formula (II)-(6) wherein $R^1$, $R^2$=H, and a resist pattern was formed using this positive resist material.

Due to the above, a rectangular pattern of 1 μm side and an isolated line pattern of 0.10 μm width were simultaneously formed more efficiently and in a shorter time from the resist pattern than if both patterns were formed only by EB exposure.

EXAMPLE 7

A positive resist material was prepared as in Example 1 except that, in Example 1, the second photo-acid generator was a substance expressed by the general formula (II)-(7) wherein M=P, and a resist pattern was formed using this positive resist material.

Due to the above, a rectangular pattern of 1 μm side and an isolated line pattern of 0.10 μm width were simultaneously formed more efficiently and in a shorter time from the resist pattern than if both patterns were formed only by EB exposure.

EXAMPLE 8

A positive resist material was prepared as in Example 1 except that, in Example 1, the second photo-acid generator was a substance expressed by the general formula (II)-(8) wherein M=P, and a resist pattern was formed using this positive resist material.

Due to the above, a rectangular pattern of 1 μm side and an isolated line pattern of 0.10 μm width were simultaneously formed more efficiently and in a shorter time from the resist pattern than if both patterns were formed only by EB exposure.

EXAMPLE 9

A positive resist material was prepared as in Example 1 except that, in Example 1, the second photo-acid generator was a substance expressed by the general formula (II)-(9), and a resist pattern was formed using this positive resist material.

Due to the above, a rectangular pattern of 1 μm side and an isolated line pattern of 0.10 μm width were simultaneously formed more efficiently and in a shorter time from the resist pattern than if both patterns were formed only by EB exposure.

EXAMPLE 10

-Flash Memory and its Manufacture-

Example 10 is an example of the semiconductor device of the present invention using the resist material of the present invention, and its method for manufacture. In this Example 10, the resist films 26, 27, 29, 32 and 34 described below are formed by an identical method to that of Example 1 using the resist material of the present invention.

Figure 3A:
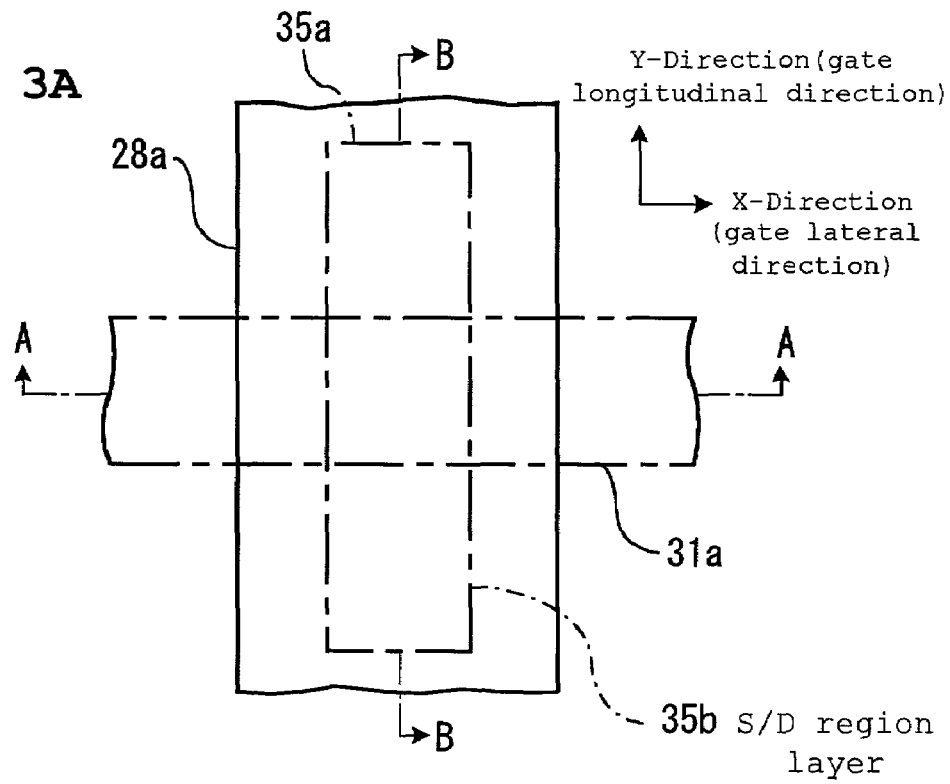
FIGS. 3A and 3B are upper surface views of a FLASH EPROM that is one example of a semiconductor device according to the present invention.
Figure 3B:
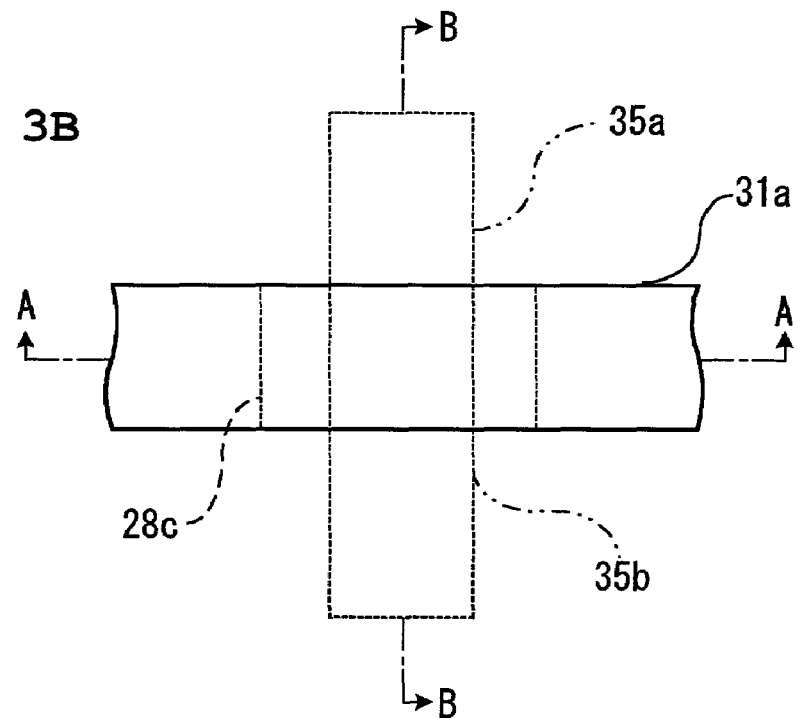

FIGS. 3A and 3B are upper surface views (plan views) of a FLASH EPROM called FLOTOX type or ETOX type. FIGS. 4A-C, FIGS. 5D-F, and FIGS. 6G-I are schematic sectional views for illustrating one example for the manufacturing method for the FLASH EPROM, wherein the left views in FIGS. 4A-6I are schematic sectional (A-directional sectional) views in the gate lateral direction (X-direction in FIG. 3A) of the part for forming a MOS transistor having a floating gate electrode in a memory cell pat (first element region), the central views are schematic sectional (B-directional sectional) views in the gate longitudinal direction (Y-direction in FIG. 3A) orthogonal to the X-direction in the memory cell part of the same part as in the left views, and the right views are schematic sectional (A-directional sectional in FIG. 3B) views of the part for forming a MOS transistor in a peripheral circuit part (second element region).

A field oxide film 23 by $SiO_2$ film was selectively formed on the element separating region on a p-type Si substrate 22 as shown in FIG. 4A. Thereafter, a first gate insulation film 24a in the MOS transistor of the memory cell part (first element region) was formed with $SiO_2$ film by thermal oxidation so as to have a thickness of 100-300 Å, and a second gate insulation film 24b in the MOS transistor of the peripheral circuit part (second element region) was also formed with $SiO_2$ film by thermal oxidation so as to have a thickness of 100-500 Å in another process. When the first gate insulation film 24a and the second gate insulation film 24b are formed in the same thickness, the oxide films may be formed simultaneously in the same process.

In order to form the MOS transistor having a n-depression type channel in the memory cell part (the left and central views in FIG. 4A), the peripheral circuit part (the right view in FIG. 4A) was masked with a resist film 26 for the purpose of controlling threshold voltage. To the region for forming a channel region just under the floating gate electrode, phosphor (P) or arsenic (As) was introduced as n-type impurity in a dose of $1 \times 10^{11}$-$1 \times 10^{14}$ cm$^{-2}$ by ion implantation to form a first threshold control layer 25a. The dose and conductive type of the impurity can be properly selected depending on selection of depression type or accumulation type.

In order to form the MOS transistor having a n-depression type channel in the peripheral circuit part (the right view of FIG. 4B), the memory cell part (the left and central views in FIG. 4B) was masked with a resist film 27 for the purpose of controlling the threshold voltage. To the region for forming a channel region just under the gate electrode, phosphor (P) or arsenic (As) was introduced as n-type impurity in a dose of $1 \times 10^{11}$-$1 \times 10^{14}$ cm$^{-2}$ by ion implantation to form a second threshold control layer 25b.

A first polysilicon film (first conductor film) 28 500-2000 Å thick was formed on the whole surface as the floating gate electrode of the MOS transistor of the memory cell part (the left and central views in FIG. 4C) and the gate electrode of the MOS transistor of the peripheral circuit part (the right view in FIG. 4C).

The first polysilicon film 28 was patterned with a resist film 29 formed as a mask, as shown in FIG. 5D, to form a floating gate electrode 28a in the MOS transistor of the memory cell part (the left and central views in FIG. 5D). At this time, the patterning was performed in X-direction so as to have a final dimension width, as shown in FIG. 5D, but not in Y-direction to leave the region for forming a S/D region layer as covered with the resist film 29.

After the resist film 29 was removed as shown in the left and central views in FIG. 5E, a capacitor insulation film 30a consisting of $SiO_2$ film was formed in a thickness of about 200-500 Å by thermal oxidation so as to cover the floating gate electrode 28a. At this time, a capacitor insulating film 30b consisting of $SiO_2$ film is also formed on the first polysilicon film 28 of the peripheral circuit part (the right view in FIG. 5E). The capacitor insulation films 30a and 30b, which were formed of only $SiO_2$ films herein, may be formed of a composite film consisting of $SiO_2$ film and $Si_3N_4$ film laminated in 2-3 layers.

A second polysilicon film (second conductor film) 31 forming a control gate electrode was formed in a thickness of 500-2000 Å, as shown in FIG. 5E, so as to cover the floating gate electrode 28a and the capacitor insulation film 30a.

The memory cell part (the left and central views in FIG. 5F) was masked with a resist film 32 as shown in FIG. 5F, and the second polysilicon film 31 and capacitor insulation film 30b of the peripheral circuit part (the right view in FIG. 5F) were successively removed by etching to expose the first polysilicon film 28.

Figure 6G:
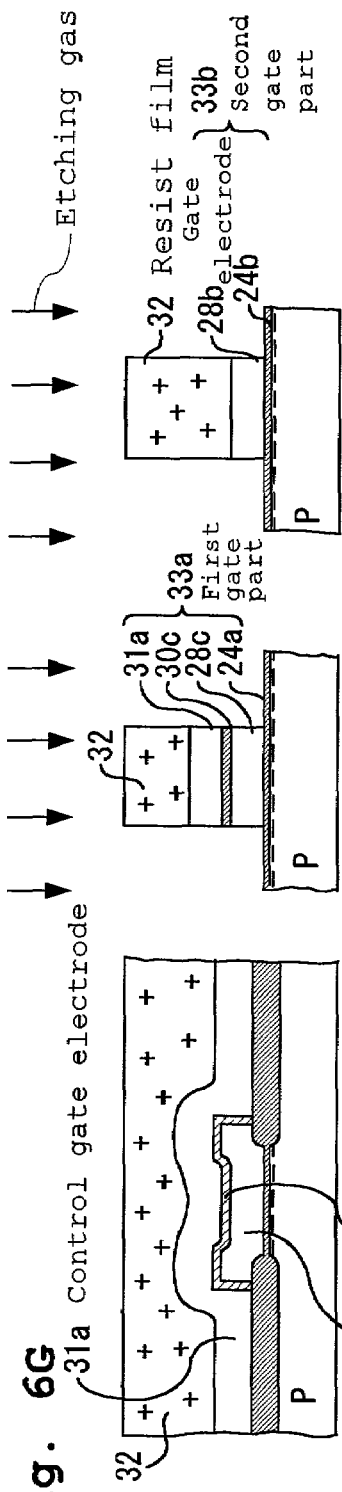
FIGS. 6G through 6I are schematic sectional views (3) for describing a manufacturing method for FLASH EPROM that is one example of a manufacturing method for semiconductor device according to the present invention.
Figure 6H:
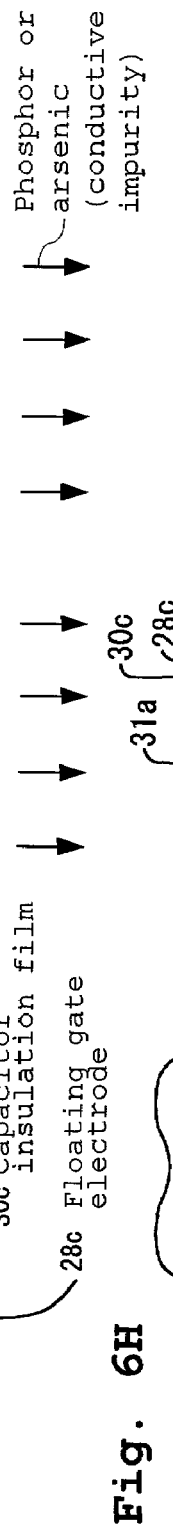

The second polysilicon film 31, capacitor insulation film 30a and first polysilicon film 28a patterned only in X-direction of the memory cell part (the left and central views in FIG. 6G) were patterned in Y-direction with the resist film 32 as a mask so as to have the final dimension of a first gate part 33a as shown in FIG. 6G, whereby a lamination by a control gate electrode 31a/a capacitor insulation film 30c/a floating gate electrode 28c about 1 μm in width was formed in Y-direction. The first polysilicon film 28 of the peripheral circuit part (the right view in FIG. 6G) was also patterned with the resist film 32 as a mask so as to have the final dimension of a second gate part 33b, whereby a gate electrode 28b about 1 μm in width was formed.

By use of the lamination by the control gate electrode 31a/the capacitor insulation film 30c/the floating gate electrode 28c of the memory cell part (the left and central views in FIG. 6H) as mask, phosphor (P) or arsenic (As) was introduced to the Si substrate 22 in the element forming region in a dose of $1 \times 10^{14}$-$1 \times 10^{16}$ cm$^{-2}$ by ion plantation to form n-type S/D region layers 35a and 35b. Further, by use of the gate electrode 28b of the peripheral circuit part (the right view in FIG. 6H) as mask, phosphor (P) or arsenic (As) was introduced as n-type impurity in a dose of $1 \times 10^{14}$-$1 \times 10^{16}$ cm$^{-2}$ to the Si substrate 22 in the element forming region to form S/D region layers 36a and 36b.

Figure 6I:
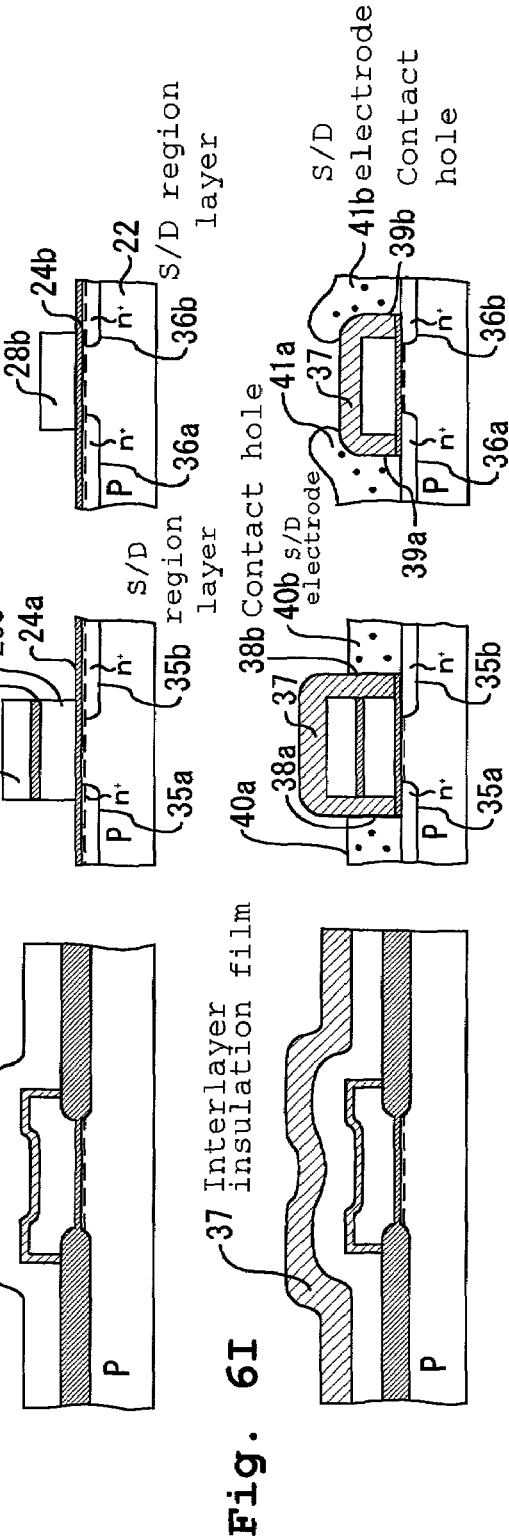

An interlayer insulation film 37 by PSG film was formed in a thickness of about 5000 Å so as to cover the first gate part 33a of the memory cell part (the left and central views in FIG. 6I) ad the second gate part 33b of the peripheral circuit part (the right view in FIG. 6I).

Thereafter, contact holes 38a and 38b and contact holes 39a and 39b were formed in the interlayer insulating film 37 formed on the S/D region layers 35a and 35b and the S/D region layers 36a and 36b, and S/D electrodes 40a and 40b and S/D electrodes 41a and 41b were then formed.

According to the above, a FLASH EPROM was manufactured as semiconductor device as shown in FIG. 6I.

In this FLASH EPROM, since the second gate insulating film 24b of the peripheral circuit part (the right views in FIGS. 4A-5F) are always covered with the first polysilicon film 28 or gate electrode 28b after the formation (the right views in FIGS. 5C-5F), the second gate insulating film 24b keeps the originally formed thickness. Therefore, the thickness control of the second gate insulating film 24b can be facilitated, and the adjustment of conductive impurity concentration for the control of threshold voltage can be also facilitated.

In the above example, the patterning for the formation of the first gate part 33a is performed with a prescribed width first in the gate lateral direction (X-direction in FIG. 3A) and then in the gate longitudinal direction (Y-direction in FIG. 3A) to form a final prescribed width, but the patterning may be reversely performed with the prescribed width first in the gate longitudinal direction (Y-direction in FIG. 3A) and then in the gate lateral direction (X-direction in FIG. 3A) to form the final prescribed width.

The example of manufacture of FLASH EPROM shown in FIGS. 7A-C is the same as the above example except changing the following process after the process shown in FIG. 5F in the above embodiment as shown in FIGS. 7A-C. Namely, the different point from the above example is that a high melting point metallic membrane (fourth conductor film) 42 consisting of tungsten (W) film or titanium (Ti) film was formed in a thickness of about 2000 Å on the second polysilicon film 31 of the memory cell part (the left and central views in FIG. 7A) and the first polysilicon film 28 of the peripheral circuit part (the right view in FIG. 7A) to provide a polycide film. The processes after FIG. 7A or the processes shown in FIGS. 7B-C were performed in the same manner as in FIGS. 6G-I. The description for the same process as FIGS. 6G-I was omitted, and the same part as in FIGS. 6G-I was shown by the same reference mark in FIGS. 7A-C.

According to the above, a FLASH EPROM was manufactured as semiconductor device as shown in FIG. 7C.

In this FLASH EPROM, since the high melting point metallic membranes (fourth conductor films) 42a and 42b are provided on the control gate electrode 31a and the gate electrode 28b, the electric resistance can be further reduced.

As the high melting point metallic membrane (fourth conductor film), a high melting point metal silicide membrane such as titanium silicide (TiSi) membrane, etc. may be used in addition to the above-mentioned high melting point metallic membranes (fourth conductor films) 42a and 42b.

The example of manufacture of FLASH EPROM shown in FIGS. 8A-C is the same as the above example except constituting the second gate part 33c of the peripheral circuit part (second element region) (the right view in FIG. 8A) to have a structure consisting of a first polysilicon film 28b (first conductor film)/a $SiO_2$ film 30d (capacitor insulation film)/a second polysilicon film 31b (second conductor film) similarly to the first gate part 33a of the memory cell part (first element region) (the left and central views in FIG. 8A), and short-circuiting the first polysilicon film 28b and the second polysilicon film 31b to form a gate electrode as shown in FIGS. 8B or C.

As shown in FIG. 8B, an opening part 52a extending through the first polysilicon film 28b (first conductor film)/the $SiO_2$ film 30d (capacitor insulation film)/the second polysilicon film 31b (the second conductor film) is formed, for example, in a position different from the second gate part 33c shown in FIG. 8A, e.g., on an insulation film 54, and a third conductor film, for example, a high melting point metallic membrane 53a such as W film, Ti film, etc. is buried in the opening part 52a, whereby the first polysilicon film 28b and the second polysilicon film 31b are short-circuited. As shown in FIG. 8C, an opening part 52b extending through the first polysilicon film 28b (first conductor film)/the $SiO_2$ film 30d (capacitor insulation film) is formed to expose the first polysilicon film 28b of the lower layer to the bottom of the opening part 52b, and a third conductor film, for example, a high melting point metallic membrane 53b such as W film, Ti film, etc. is buried in the opening part 52b, whereby the first polysilicon film 28b and the second polysilicon film 31b are short-circuited.

In this FLASH EPROM, since the second gate part 33c of the peripheral circuit part has the same structure as the first gate part 33a of the memory cell part, the peripheral circuit part can be formed simultaneously with the formation of the memory cell part to effectively simplify the manufacturing process.

The third conductor film 53a or 53b and the high melting point metallic membrane (fourth conductor film) 42 may be simultaneously formed as a common high melting point metallic membrane in addition to the above independent formation.

EXAMPLE 11

-Manufacture of Magnetic Head-

Example 11 relates to the manufacture of a magnetic head, which is an example of the application of the resist pattern of the present invention using the resist material of the present invention. In Example 11, the resist patterns 102 and 126 described below are formed by an identical method to that of Example 1 using the resist material of the present invention.

FIGS. 9A-D are flowcharts for illustrating the manufacture of the magnetic head.

Figure 9A:
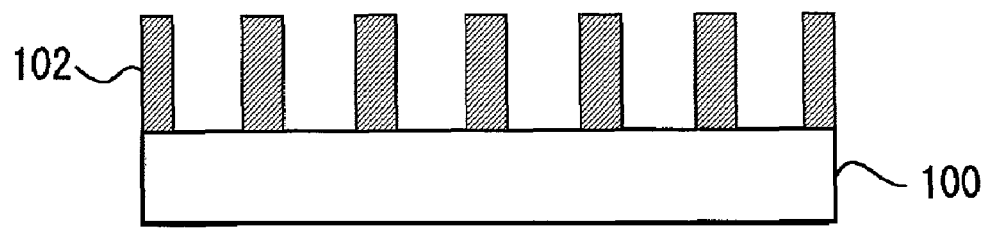
FIGS. 9A through 9D are schematic sectional views for describing one example of the application of a resist pattern thickened by use of the resist pattern thickening material of the present invention to manufacture of a magnetic head.

A resist film was formed on an interlayer insulation layer 100 in a thickness of 6 μm, as shown in FIG. 9A, followed by exposure and development to form a resist pattern 102 having an opening pattern for forming a spiroid thin film magnetic coil.

Figure 9B:
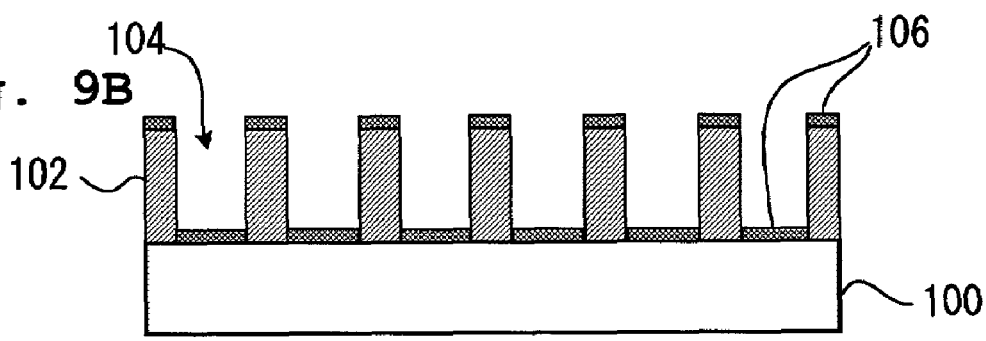

A plating underlying layer 106 consisting of the lamination of a Ti adhesion layer 0.01 μm thick and a Cu adhesion layer 0.05 μm thick was formed by evaporation, as shown in FIG. 9B, on the resist pattern 102 and the part having no resist pattern 102 formed thereon or the exposed surface of the opening part 104 on the interlayer insulation layer 100.

Figure 9C:
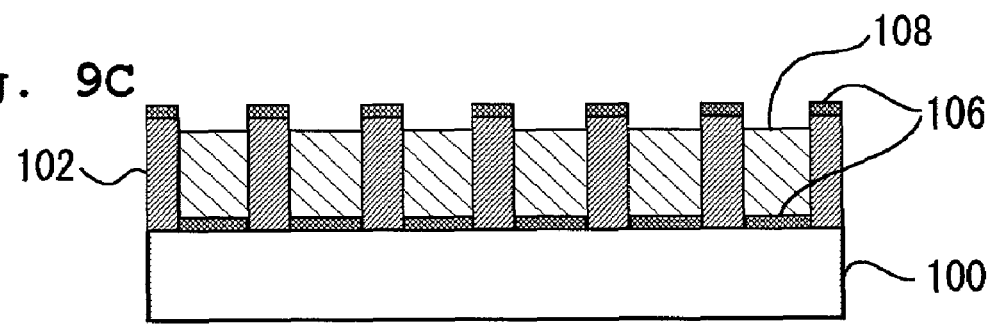

A thin film conductor 108 consisting of a Cu plating film 3 μm thick was formed, as shown in FIG. 9C, in the part having no resist pattern 102 formed thereon, or on the surface of the plating underlying layer 106 formed on the exposed surface of the opening part 104 on the interlayer insulation layer 100.

Figure 9D:
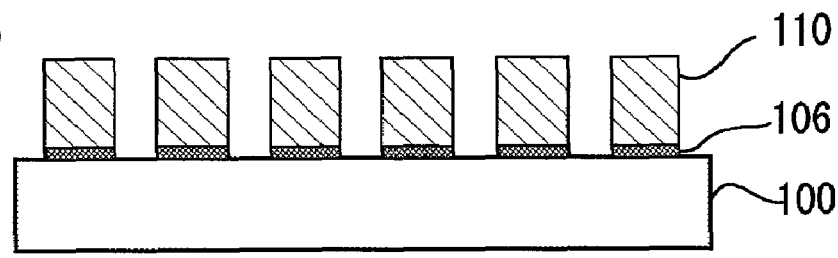

When the resist pattern 102 is dissolved and removed and lifted off from the interlayer insulation layer 100 as shown in FIG. 9D, a thin film magnetic coil 110 by the spiroid pattern of the thin film conductor 108 is formed.

According to the above, the magnetic head was manufactured.

The magnetic head obtained herein is finely formed as a spiroid pattern from the resist pattern 102 using the resist material of the present invention, so the thin film magnetic coil 110 is detailed and highly precise, and it is also excellent for mass production.

FIGS. 10-15 are flowcharts for illustrating the manufacture of another magnetic head.

Figure 10:
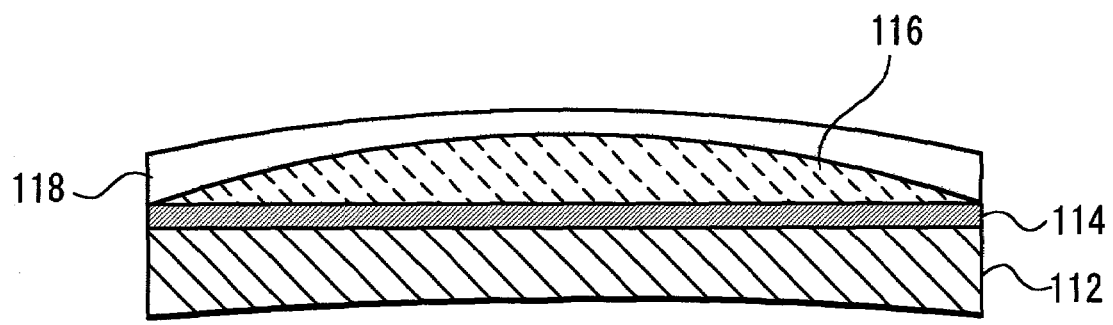
FIG. 10 is a schematic sectional view for describing a process (1) of another example of the application of the resist pattern thickened by use of the resist pattern thickening material of the present invention to manufacture of a magnetic head.

A gap layer 114 was formed on a ceramic nonmagnetic substrate 112 by sputtering as shown in FIG. 10. An insulator layer by silicon oxide and a conductive underlying layer consisting of Ni—Fe permalloy, which are not shown, are preliminarily formed on the nonmagnetic substrate 112 by sputtering, and a lower magnetic layer consisting of Ni—Fe permalloy is further formed thereon. A resin insulation film 116 was formed by use of a thermosetting resin in a prescribed region on the gap layer 114 except the part forming the magnetic tip of the lower magnetic layer not shown. A resist material was then applied to the resin insulation film 116 to form a resist film 118.

Figure 11:
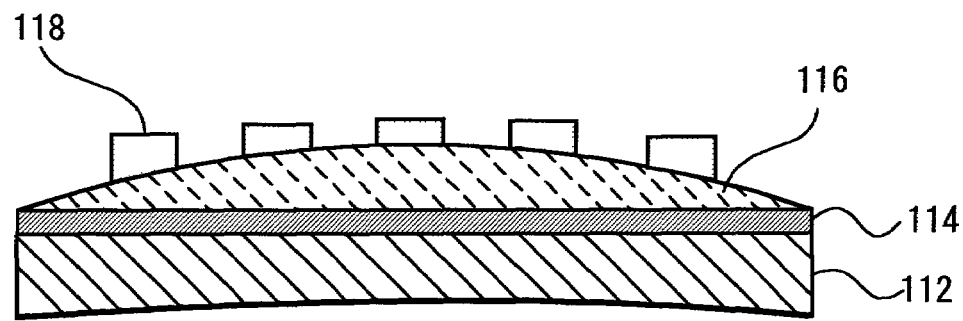
FIG. 11 is a schematic sectional view for describing a process (2) of another example of the application of the resist pattern thickened by use of the resist pattern thickening material of the present invention to manufacture of a magnetic head.
Figure 12:
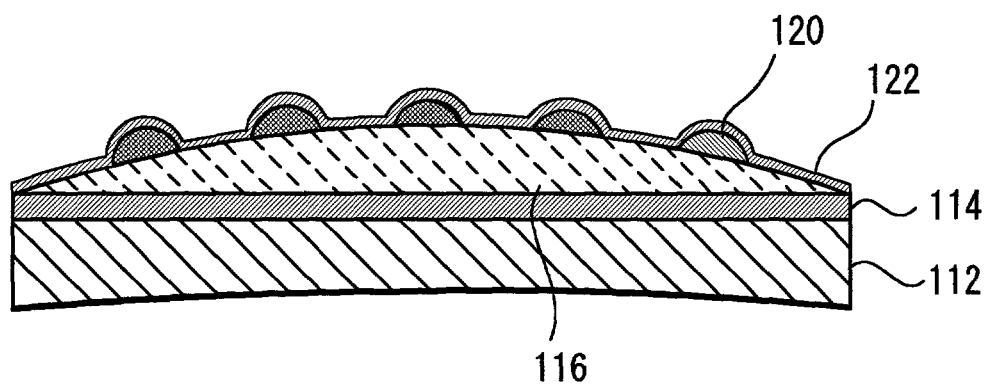
FIG. 12 is a schematic sectional view for describing a process (3) of another example of the application of the resist pattern thickened by use of the resist pattern thickening material of the present invention to manufacture of a magnetic head.

The resist film 118 was then subjected to exposure and development, as shown in FIG. 11, to form a spiroid pattern. The resist film 118 of the spiroid pattern was thermally set at several hundreds° C. for about 1 hr as shown in FIG. 12 to form a projection-like first spiroid pattern 120. A conductive underlying layer 122 consisting of Cu was further formed on the surface thereof so as to cover it.

Figure 13:
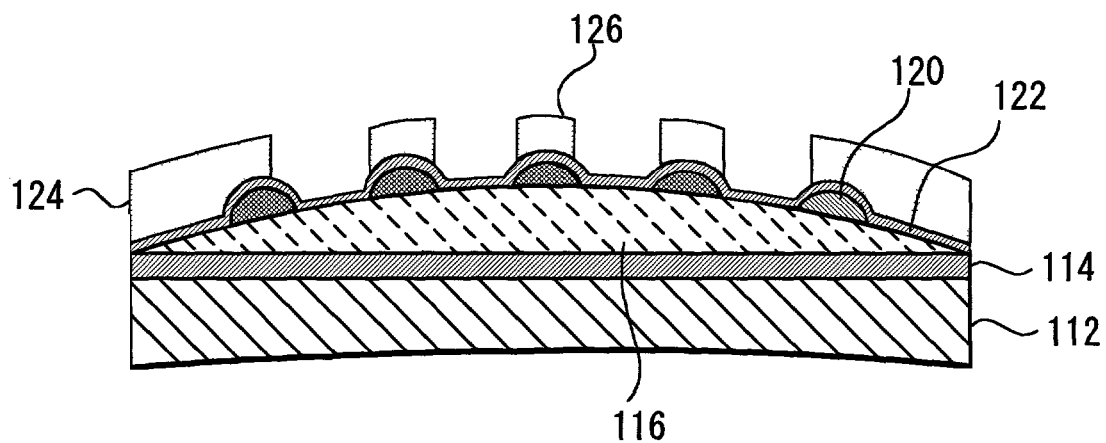
FIG. 13 is a schematic sectional view for describing a process (4) of another example of the application of the resist pattern thickened by use of the resist pattern thickening material of the present invention to manufacture of a magnetic head.

A resist material was applied onto the conductive underlying layer 122 by spin coating to form a resist film 124, as shown in FIG. 13, and the resist film 124 was patterned on the first spiroid pattern 120 to form a resist pattern 126.

Figure 14:
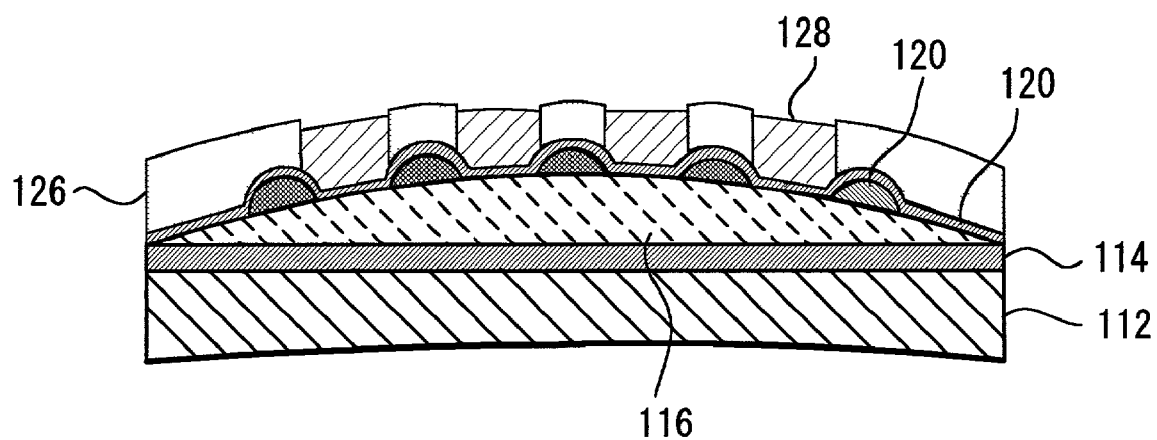
FIG. 14 is a schematic sectional view for describing a process (5) of another example of the application of the resist pattern thickened by use of the resist pattern thickening material of the present invention to manufacture of a magnetic head.
Figure 15:
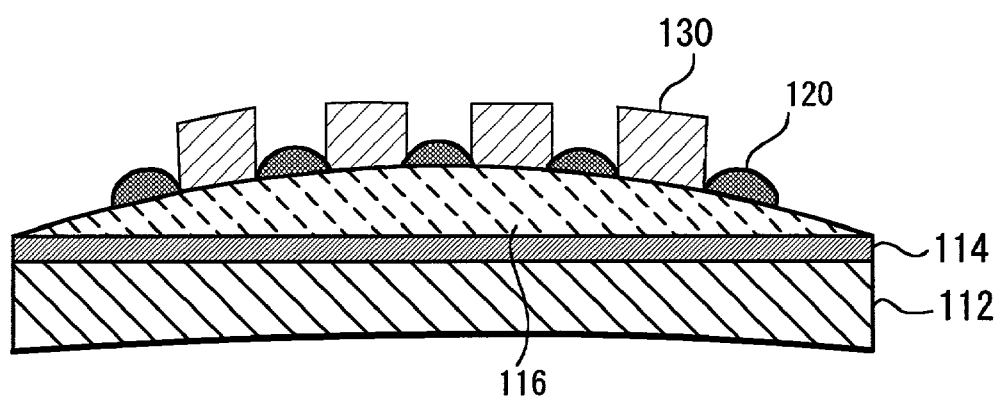
FIG. 15 is a schematic sectional view for describing a process (6) of another example of the application of the resist pattern thickened by use of the resist pattern thickening material of the present invention to manufacture of a magnetic head.

A Cu conductor layer 128 is formed by plating, as shown in FIG. 14, on the exposed surface of the conductive underlying layer 122, or on the part having no resist pattern 126 formed thereon. Thereafter, the resist pattern 126 was lifted off, as shown in FIG. 15, from the conductive underlying layer 122 by being dissolved and removed to form a spiroid thin film magnetic coil 130 by the Cu conductor layer 128.

Figure 16:
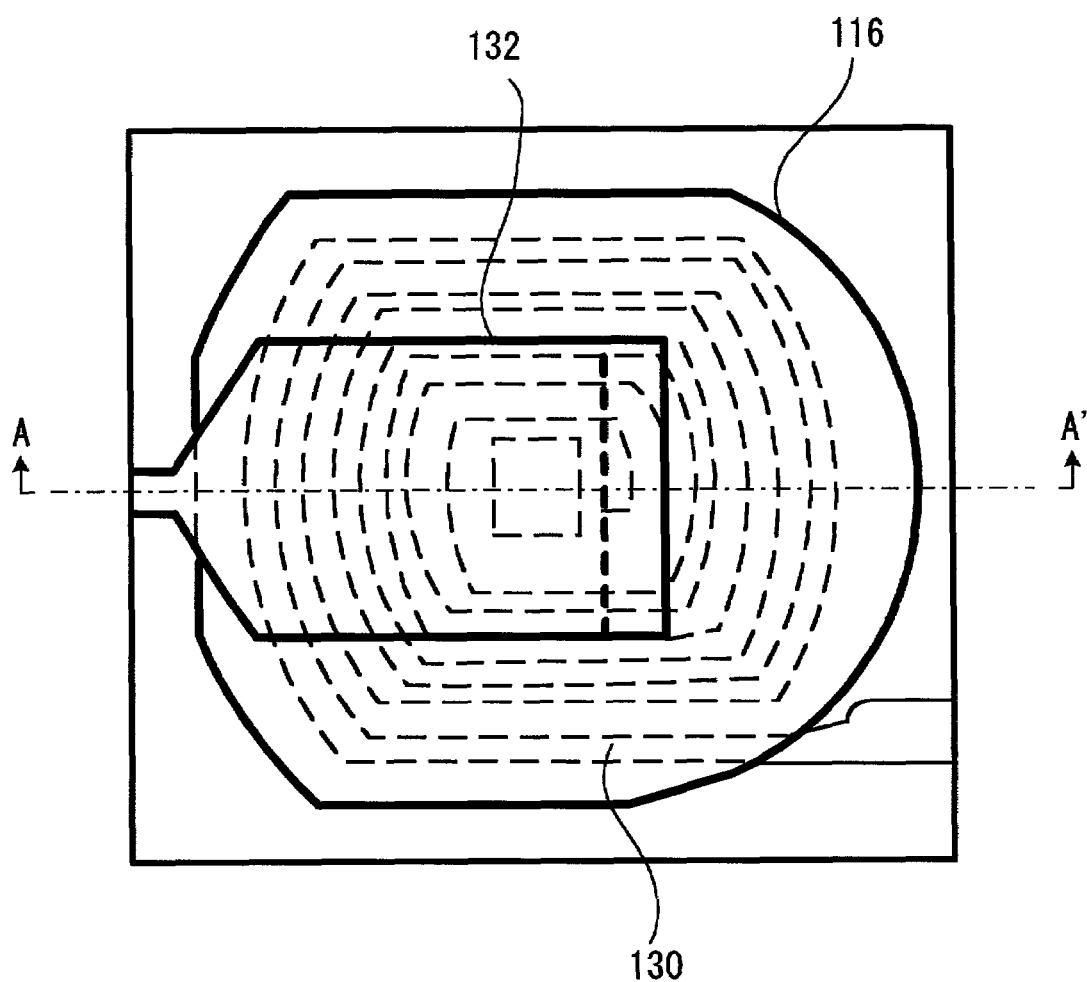
FIG. 16 is a plan view showing one example of the magnetic head manufactured in the processes of FIGS. 10-15.

According to the above, a magnetic head having the magnetic layer 132 on the resin insulation film 116 and the thin film magnetic coil 130 on the surface, as shown in the plan view of FIG. 16, was manufactured.

In the resulting magnetic head, since a spiroid pattern is minutely formed by the resist pattern 126 thickened by use of the resist material according to the present invention formed thereon, the thin film magnetic coil 130 is minute and fine, and also excellent in mass-productivity.

EXAMPLE 12

-Manufacture of T Gate Electrode-

Example 12 is related to the manufacture of a T gate electrode, which is in example of the application of the resist pattern of the present invention using the resist material of the present invention. In Example 12, in the resist material of the present invention, the lower layer 5 and upper layer 9 described below are formed from a chemically amplified type resist material. The lower layer 5 comprises a photo-acid generator which is photosensitive to a charged particle beam, and the upper layer 9 comprises a photo-acid generator which is sensitive to light (i line, g line, KrF laser, ArF laser).

As shown in FIG. 1, the resist material of the present invention was coated on a substrate 1, the aforementioned step for selectively exposing was performed to form a reverse taper shaped pattern having a large opening, the step for selectively exposing was performed in this opening to form a smaller opening than this opening, a step for baking was performed wherein the product was baked at 70° C. for 120 seconds, developing was performed using a 2.38 mass % aqueous solution of tetramethylammonium hydroxide, and a resist pattern was formed to manufacture a T-gate electrode for high electron mobility transistor devices.

Subsequently, the T gate electrode was formed by implanting a conductor by vacuum deposition inside the pattern (opening 3) due to this resist pattern.

According to the present invention, the above problems inherent in the prior art can be resolved in response to the demand, and a resist pattern which forms fine patterns suitable for semiconductor device manufacture, a method for forming a resist pattern which can manufacture these resist patterns efficiently in a short time, a resist material which is suitable for use in this resist pattern manufacture and can form fine patterns efficiently in a short time, a semiconductor device having these fine patterns formed by the resist pattern and a semiconductor manufacturing method which can manufacture this semiconductor device efficiently in a short time, are provided.

What is claimed is:

1. A resist material comprising:

a) a first photo-acid generator exhibiting an absorption peak to exposure light having a wavelength of less than 300 nm, wherein the first photo-acid generator is an onium salt compound expressed by $(R^1)^+X^-$, where $X^-$ is an anion, and $(R^1)^+$ is selected from the group consisting of the compounds expressed by formulae below:

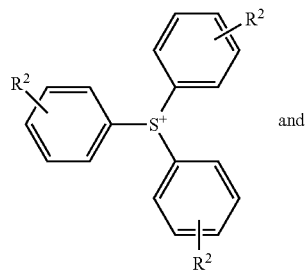

and

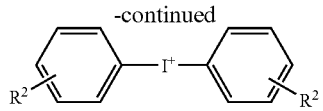

wherein $R^2$ represents a substituent group;

b) a second photo-acid generator exhibiting an absorption peak to exposure light having a wavelength of 300 nm or more, wherein the second photo-acid generator is selected from the group consisting of the compounds expressed by formulae below,

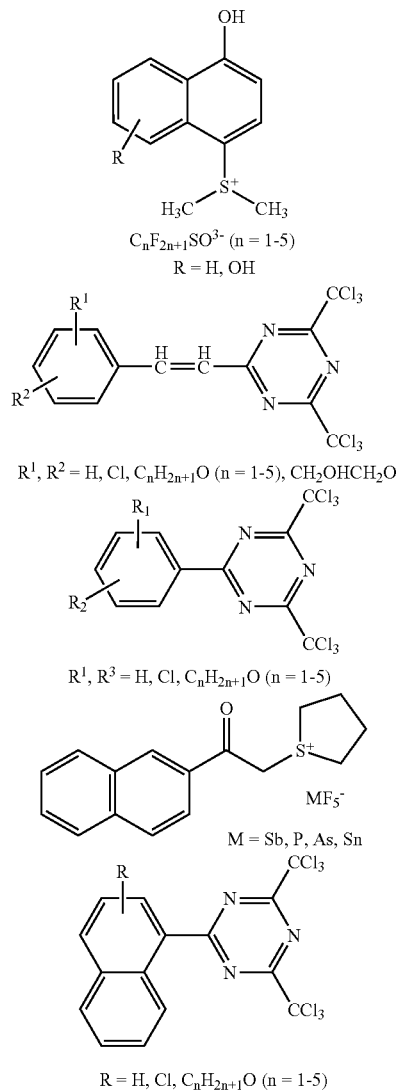

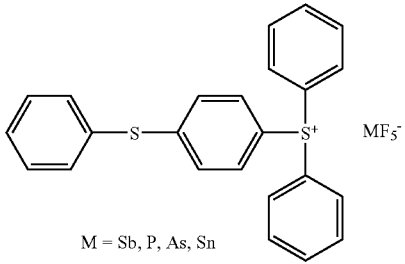

-continued

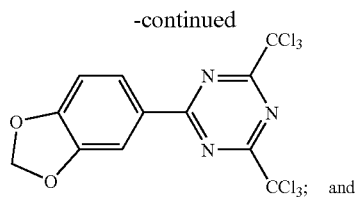
; and c) a resin of a polarity changeable type, wherein 5-80% of all polar groups in the resin are substituted by a protective group, wherein the protective group is eliminated by an acid resulting from the first and second photo-acid generators, and wherein the protective group is a hydrophobic protective group which is an adamantyl or norbornane functional group expressed by the formula below,

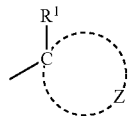

where "$R^1$" represents a straight chain, branched or cyclic alkyl group having 1 to 4 carbon atoms, which may be substituted or non-substituted, and "Z" represents a plurality of atoms which forms one of a substituted or non-substituted adamantyl group and a substituted or non-substituted norbornane functional group,
wherein the resist material is a positive resist material.

2. A resist material according to claim 1, wherein, in the first photo-acid generator, number of molecules which react to exposure light having a wavelength of 300 nm or more, is ⅕ of the number of molecules which react to exposure light having a wavelength of less than 300 nm, and in the second photo-acid generator, the number of molecules which react to exposure light having a wavelength of less than 300 nm, is ⅕ of the number of molecules which react to exposure light having a wavelength of 300 nm or more.

3. A resist material according to claim 1, wherein the exposure light having a wavelength of 300 nm or more is ultraviolet light, and the exposure light having a wavelength of less than 300 nm is a charged particle beam.

4. A resist material according to claim 1, wherein if the resin is a copolymer, the resin has crosslinking rate of 5-80%.

5. A resist material according to claim 1, wherein the resin contains at least one type selected from a (meth)acrylate ester polymer, vinylphenol polymer, N-substituted maleimide polymer and styrene polymer.

6. A resist material according to claim 1, wherein the absorption in an ultraviolet wavelength region is 1.75 or less.

7. A resist material according to claim 1, wherein the resist material is used in forming a pattern having an opening diameter of 0.2 μm or less.

8. A resist material according to claim 1, wherein the resist material is used in a manufacturing of a high electron mobility transistor device.

* * * * *